US012379660B2

(12) United States Patent
Kaitz et al.

(10) Patent No.: US 12,379,660 B2
(45) Date of Patent: Aug. 5, 2025

(54) ADHESION PROMOTING PHOTORESIST UNDERLAYER COMPOSITION

(71) Applicant: ROHM AND HAAS ELECTRONIC MATERIALS LLC, Marlborough, MA (US)

(72) Inventors: Joshua Kaitz, Watertown, MA (US); Ke Yang, Westborough, MA (US); Keren Zhang, Kirkland, WA (US); Li Cui, Westborough, MA (US); James F. Cameron, Brookline, MA (US); Dan B. Millward, Ukiah, CA (US); Shintaro Yamada, Shrewsbury, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 1008 days.

(21) Appl. No.: 17/127,434

(22) Filed: Dec. 18, 2020

(65) Prior Publication Data
US 2022/0197143 A1 Jun. 23, 2022

(51) Int. Cl.
| | |
|---|---|
| *G03F 7/11* | (2006.01) |
| *C08G 65/40* | (2006.01) |
| *C08K 5/053* | (2006.01) |
| *C08K 5/06* | (2006.01) |
| *C08K 5/09* | (2006.01) |
| *C08K 5/105* | (2006.01) |
| *C08K 5/19* | (2006.01) |
| *C09D 171/00* | (2006.01) |

(52) U.S. Cl.
CPC ............ *G03F 7/11* (2013.01); *C08G 65/4012* (2013.01); *C09D 171/00* (2013.01); *C08K 5/053* (2013.01); *C08K 5/06* (2013.01); *C08K 5/09* (2013.01); *C08K 5/105* (2013.01); *C08K 5/19* (2013.01)

(58) Field of Classification Search
CPC ....................................................... G03F 7/11
See application file for complete search history.

(56) References Cited

U.S. PATENT DOCUMENTS

| | | | |
|---|---|---|---|
| 5,115,082 A | 5/1992 | Mercer et al. | |
| 5,155,175 A | 10/1992 | Mercer et al. | |
| 5,179,188 A | 1/1993 | Mercer et al. | |
| 5,874,516 A | 2/1999 | Burgoyne, Jr. et al. | |
| 5,965,679 A | 10/1999 | Godschalx et al. | |
| 6,261,743 B1 | 7/2001 | Pavelchek et al. | |
| 6,288,188 B1 | 9/2001 | Godschalx et al. | |
| 6,646,081 B2 | 11/2003 | Godschalx et al. | |
| 8,795,955 B2 | 8/2014 | Kinsho et al. | |
| 8,835,697 B2 | 9/2014 | Kori et al. | |
| 9,045,587 B2 | 6/2015 | Kinsho et al. | |
| 9,996,007 B2 | 6/2018 | Jung et al. | |
| 2009/0081377 A1* | 3/2009 | Kubo | C08K 5/0025 524/550 |
| 2009/0247701 A1* | 10/2009 | Inabe | C08L 25/06 525/88 |
| 2016/0060393 A1 | 3/2016 | Gilmore et al. | |
| 2016/0266494 A1 | 9/2016 | Kim et al. | |
| 2017/0009006 A1 | 1/2017 | Ding et al. | |
| 2017/0015779 A1* | 1/2017 | Jung | G03F 7/38 |
| 2018/0011405 A1 | 1/2018 | Watanabe et al. | |
| 2018/0157175 A1* | 6/2018 | Liu | G03F 7/091 |
| 2018/0162968 A1* | 6/2018 | Kinzie | C08L 45/00 |
| 2018/0284614 A1 | 10/2018 | Satoh et al. | |
| 2018/0284615 A1 | 10/2018 | Nagai et al. | |
| 2019/0041752 A1 | 2/2019 | Tachibana et al. | |
| 2019/0041753 A1 | 2/2019 | Tachibana et al. | |
| 2019/0146346 A1* | 5/2019 | Cameron | G03F 7/094 430/306 |
| 2020/0044158 A1* | 2/2020 | Nakasugi | C07C 39/04 |
| 2020/0142309 A1 | 5/2020 | Liu et al. | |
| 2020/0199093 A1 | 6/2020 | Nakatsu et al. | |
| 2020/0272053 A1 | 8/2020 | Nosaka et al. | |
| 2020/0319561 A1 | 10/2020 | Endo et al. | |
| 2020/0348592 A1 | 11/2020 | Kaitz et al. | |
| 2022/0155682 A1 | 5/2022 | Horiuchi et al. | |

FOREIGN PATENT DOCUMENTS

| | | | | |
|---|---|---|---|---|
| EP | 0755957 A1 | | 1/1997 | |
| TW | 202030232 A | * | 8/2020 | ............. C08F 30/08 |
| WO | 9701593 A1 | | 1/1997 | |
| WO | 9710193 A1 | | 3/1997 | |
| WO | 2004073824 A2 | | 9/2004 | |
| WO | 2005030848 A1 | | 4/2005 | |
| WO | 2019124475 A1 | | 6/2019 | |

OTHER PUBLICATIONS

English Machine Translation of Takeuchi (TW202030232A) (Year: 2020).*
Ryu et al., "Polydopamine Surface Chemistry: A Decade of Discovery", ACS Appl. Mater. Interfaces 2018, 10, 7523-7540.

* cited by examiner

*Primary Examiner* — Mark F. Huff
*Assistant Examiner* — Andrew Preston Traywick
(74) *Attorney, Agent, or Firm* — CANTOR COLBURN LLP

(57) ABSTRACT

A photoresist underlayer composition comprising a poly (arylene ether); an additive of formula (14):

$$D\text{-}(L^1\text{-}Ar\text{---}[X]_n)_m \qquad (14); \text{ and}$$

a solvent, wherein, in formula (14), D is a substituted or unsubstituted $C_{1-60}$ organic group, optionally wherein D is an organic acid salt of the substituted or unsubstituted $C_{1-60}$ organic group; each $L^1$ is independently a single bond or a divalent linking group, when $L^1$ is a single bond, D may be a substituted or unsubstituted $C_{3-30}$ cycloalkyl or substituted or unsubstituted $C_{1-20}$ heterocycloalkyl that is optionally fused with Ar, each Ar is independently a monocyclic or polycyclic $C_{5-60}$ aromatic group, each X is independently —$OR^{30}$, —$SR^{31}$, or —$NR^{32}R^{33}$, m is an integer of 1 to 6, each n is independently an integer of 0 to 5, provided that a sum of all n is 2 or greater, and $R^{30}$ to $R^{33}$ are as provided herein.

18 Claims, No Drawings

ADHESION PROMOTING PHOTORESIST UNDERLAYER COMPOSITION

FIELD

The present invention relates generally to the field of electronic devices, and more specifically to the field of materials and methods for use in semiconductor manufacturing.

BACKGROUND

Photoresist underlayer compositions are used in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content.

An ideal photoresist underlayer material should possess certain specific characteristics: it should be capable of being cast onto a substrate by a spin-coating process, should be thermally set upon heating with low out-gassing and sublimation, should be soluble in common solvents for good spin bowl compatibility, should have appropriate n & k values to work in conjunction with the anti-reflective coating layer to impart low reflectivity necessary for photoresist imaging, and should have high thermal stability to avoid being damaged during later processing steps. In addition to these requirements, the ideal photoresist underlayer material has to provide a planar film upon spin-coating and thermal curing over a substrate with topography and sufficient dry etch selectivity to silicon-containing layers located above and below the photoresist underlayer films in order to transfer the photo-patterns into the final substrate in an accurate manner.

Organic poly(arylene) compounds have been used as spin-on-carbon (SOC) materials for patterning in tri-layer or quad-layer processes. Such poly(arylene)-containing SOC formulations can have high thermal stability, high etch resistance, and good planarization under the test conditions. However, adhesion of poly(arylene)-containing materials to inorganic substrates is challenging and may pose issues in some processing steps. For example, during substrate removal by wet chemical etch, poly(arylene)-containing formulations can delaminate from the substrate, causing impermissible loss of pattern fidelity and substrate damage.

Accordingly, there remains a need for new photoresist underlayer materials that can achieve improved adhesion for SOC formulations.

SUMMARY

Provided is a photoresist underlayer composition, comprising: a poly(arylene ether); an additive of formula (14):

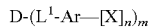

$$D\text{-}(L^1\text{-}Ar\text{---}[X]_n)_m \quad (14); \text{ and}$$

a solvent, wherein, in formula (14), D is a substituted or unsubstituted $C_{1\text{-}60}$ organic group, optionally wherein D is an organic acid salt of the substituted or unsubstituted $C_1$-60 organic group; each $L^1$ is independently a single bond or a divalent linking group, when $L^1$ is a single bond, D may be a substituted or unsubstituted $C_{3\text{-}30}$ cycloalkyl or substituted or unsubstituted $C_{1\text{-}20}$ heterocycloalkyl that is optionally fused with Ar, each Ar is independently a monocyclic or polycyclic $C_{5\text{-}60}$ aromatic group, each X is independently —$OR^{30}$, —$SR^{31}$, or —$NR^{32}R^{33}$, m is an integer of 1 to 6, each n is independently an integer of 0 to 5, provided that a sum of all n is 2 or greater, $R^{30}$ to $R^{33}$ are each independently hydrogen, substituted or unsubstituted $C_{1\text{-}30}$ alkyl, substituted or unsubstituted $C_{1\text{-}30}$ heteroalkyl, substituted or unsubstituted $C_{3\text{-}30}$ cycloalkyl, substituted or unsubstituted $C_{2\text{-}30}$ heterocycloalkyl, substituted or unsubstituted $C_{2\text{-}30}$ alkenyl, substituted or unsubstituted $C_{2\text{-}30}$ alkynyl, substituted or unsubstituted $C_{6\text{-}30}$ aryl, substituted or unsubstituted $C_{7\text{-}30}$ arylalkyl, substituted or unsubstituted $C_{7\text{-}30}$ alkylaryl, substituted or unsubstituted $C_{3\text{-}30}$ heteroaryl, or substituted or unsubstituted $C_{4\text{-}30}$ heteroarylalkyl, each of which except hydrogen optionally further comprises as part of its structure one or more of substituted or unsubstituted $C_{1\text{-}30}$ alkylene, substituted or unsubstituted $C_{3\text{-}30}$ cycloalkylene, substituted or unsubstituted $C_{2\text{-}30}$ alkenylene, substituted or unsubstituted $C_{4\text{-}30}$ cycloalkenylene, substituted or unsubstituted $C_{2\text{-}30}$ alkynylene, substituted or unsubstituted $C_{1\text{-}30}$ heterocycloalkylene, substituted or unsubstituted $C_{6\text{-}30}$ arylene, substituted or unsubstituted $C_{4\text{-}30}$ heteroarylene, —O—, —C(O)—, —C(O)O—, —S—, —S(O)—, —S(O)$_2$—, or —$NR^{34}$— wherein $R^{34}$ is substituted or unsubstituted $C_{1\text{-}30}$ alkyl, substituted or unsubstituted $C_{3\text{-}30}$ cycloalkyl, substituted or unsubstituted $C_{1\text{-}20}$ heterocycloalkyl, substituted or unsubstituted $C_{6\text{-}30}$ aryl, substituted or unsubstituted $C_{7\text{-}30}$ arylalkyl, substituted or unsubstituted $C_{7\text{-}30}$ alkylaryl, substituted or unsubstituted $C_{4\text{-}30}$ heteroaryl, substituted or unsubstituted $C_{5\text{-}30}$ heteroarylalkyl, or substituted or unsubstituted $C_{5\text{-}30}$ alkylheteroaryl, and when n is 2, optionally any one of $R^{30}$ to $R^{33}$ of a first group X is a divalent group, any one of $R^{30}$ to $R^{33}$ of a second group X is a divalent group, and the divalent group of the first group X forms a ring together with the divalent group of the second group X, wherein the ring optionally further comprises a linking group comprising one or more of substituted or unsubstituted $C_{1\text{-}30}$ alkylene, substituted or unsubstituted $C_{3\text{-}30}$ cycloalkylene, substituted or unsubstituted $C_{2\text{-}30}$ alkenylene, substituted or unsubstituted $C_{4\text{-}30}$ cycloalkenylene, substituted or unsubstituted $C_{2\text{-}30}$ alkynylene, substituted or unsubstituted $C_{6\text{-}30}$ arylene, —O—, —C(O)—, —C(O)O—, —$NR^{35}$—, —S—, —S(O)—, or —S(O)$_2$—, wherein $R^{35}$ is substituted or unsubstituted $C_{1\text{-}30}$ alkyl, substituted or unsubstituted $C_{3\text{-}30}$ cycloalkyl, substituted or unsubstituted $C_{1\text{-}20}$ heterocycloalkyl, substituted or unsubstituted $C_{6\text{-}30}$ aryl, substituted or unsubstituted $C_{7\text{-}30}$ arylalkyl, substituted or unsubstituted $C_{7\text{-}30}$ alkylaryl, substituted or unsubstituted $C_{4\text{-}30}$ heteroaryl, substituted or unsubstituted $C_{5\text{-}30}$ heteroarylalkyl, or substituted or unsubstituted $C_{5\text{-}30}$ alkylheteroaryl.

Also provided is a method of forming a pattern, the method comprising: (a) applying a layer of the photoresist underlayer composition on a substrate; (b) curing the applied photoresist underlayer composition to form a photoresist underlayer; and (c) forming a photoresist layer over the photoresist underlayer.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond; the term "aromatic group" denotes the conventional idea of aromaticity as defined in the literature, in particular in IUPAC 19, and refers to a monocyclic or polycyclic aromatic ring system that includes carbon atoms in the ring or rings, and optionally may include one or more heteroatoms independently selected from N, O, S, Si, P, or B instead of a carbon atom or carbon atoms in the ring or rings; "aryl group" refers to a monovalent, monocyclic or polycyclic aromatic group containing only carbon atoms in the aromatic ring or rings, and may include a group with an aromatic ring fused to at least one cycloalkyl or heterocycloalkyl ring; "arylene group" refers to an aryl group having a valence of at least two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, P, or B; "heteroatom-containing group" refers to a substituent group that includes at least one heteroatom; "heteroalkyl group" refers to an alkyl group having 1-4 heteroatoms instead of carbon; "heterocycloalkyl group" refers to a cycloalkyl group having 1-4 heteroatoms as ring members instead of carbon; "heterocycloalkylene group" refers to a heterocycloalkyl group having a valence of two; "heteroaryl group" refers to an aryl group having 1-4 heteroatoms as ring members instead of carbon; and "heteroarylene group" refers to an heteroaryl group having a valence of two.

The term "halogen" means a monovalent substituent that is fluorine (fluoro), chlorine (chloro), bromine (bromo), or iodine (iodo). The prefix "halo" means a group including one or more of a fluoro, chloro, bromo, or iodo substituent instead of a hydrogen atom. A combination of halo groups (e.g., bromo and fluoro), or only fluoro groups may be present.

The term "fluorinated" means a compound or group having one or more fluorine atoms incorporated into the compound or group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$). A "substituted fluoroalkyl group" shall be understood to mean a fluoroalkyl group that is further substituted by an additional substituent group.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—$NO_2$), cyano (—CN), hydroxy (—OH), oxo (=O), amino (—$NH_2$), mono- or di($C_{1-6}$)alkylamino, alkanoyl (such as a $C_{2-6}$ alkanoyl group such as acyl), formyl (—C(=O)H), carboxylic acid or an alkali metal or ammonium salt thereof; esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl); amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(═O)$_2$-alkyl), $C_{6-12}$ arylsulfonyl (—S(═O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a $C_2$ alkyl group substituted with a cyano group.

As used herein, "inertly-substituted" means the substituent groups are essentially inert to the cyclopentadienone and acetylene polymerization reactions and do not readily react under the conditions of use of the cured polymer, such as in water. Such substituent groups include, for example, —F, —Cl, —Br, —CF$_3$, —OCH$_3$, —OCF$_3$, —O-Ph, a $C_{1-8}$ alkyl, or a $C_{3-8}$ cycloalkyl.

As noted above, there remains a continuing need for new photoresist underlayer materials such as SOC formulations that have improved adhesion to inorganic substrates. The present inventors have discovered an inventive a photoresist underlayer composition that includes a poly(arylene ether); an additive of formula (1); and a solvent, which can achieve improved adhesion to underlying inorganic substrates relative to a comparable SOC formulation that does not include the inventive additive of formula (1).

The poly(arylene ether), as used herein, is a matrix polymer that has a backbone made from repeating arylene units together with oxygen linking units in the backbone. As used herein, the term "poly(arylene ether)" refers to a compound having a substituted or unsubstituted aryleneoxy structural unit (—Ar—O—), wherein "Ar" is a divalent group derived from an aromatic hydrocarbon. A "poly (arylene ether)" may refer to a poly(aryl ether), a poly(aryl ether ether ketone), a poly(aryl ether sulfone), a poly(ether imide), poly(ether imidazole), or a poly(ether benzoxazole). In each of these compounds, at least one substituted or unsubstituted aryleneoxy structural unit (—Ar—O—) is present.

Any compound containing two or more cyclopentadienone moieties capable of undergoing a Diels-Alder reaction may suitably be used as the first monomer to prepare the present polyarylene ethers. Alternatively, a mixture of two or more different first monomers, each having two or more cyclopentadienone moieties, may be used as the first monomer. Preferably, only one first monomer is used. Preferably, the first monomer has two to four cyclopentadienone moieties, and more preferably two cyclopentadienone moieties (also referred to herein as bis-cyclopentadienones). Suitable first monomers having two or more cyclopentadienone moieties are well-known in the art, such as those described in U.S. Pat. Nos. 5,965,679; 6,288,188; and 6,646,081; and in Int. Pat. Pubs. WO 97/10193, WO 2004/073824 and WO 2005/030848 (all of which are incorporated herein in their entireties by reference).

It is preferred that the first monomer has the structure shown in formula (1)

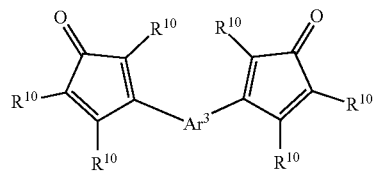

wherein each $R^{10}$ is independently chosen from H, $C_{1-6}$-alkyl, and optionally substituted $C_{5-20}$-aryl; and $Ar^3$ is an aryl moiety having from 5 to 60 carbons. In formula (1), "substituted $C_{5-20}$-aryl" refers to a $C_{5-20}$-aryl having one or more of its hydrogens replaced with one or more of halogen, $C_{1-10}$-alkyl, $C_{5-10}$-aryl, —C≡C—$C_{5-10}$-aryl, or a heteroatom-containing radical having from 0 to 20 carbon atoms and one or more heteroatoms chosen from O, S and N, preferably from halogen, $C_{1-10}$-alkyl, $C_{6-10}$-aryl, and —C≡C—$C_{6-10}$-aryl, and more preferably from phenyl and —C≡C-phenyl. As used herein, "substituted phenyl" refers to a phenyl moiety substituted with one or more of halogen, $C_{1-10}$-alkyl, $C_{5-10}$-aryl, —C≡C—$C_{5-10}$-aryl, or a heteroatom-containing radical having from 0 to 20 carbon atoms and one or more heteroatoms chosen from O, S and N, and preferably with one or more of halogen, $C_{1-10}$-alkyl, $C_{6-10}$-aryl, and —C≡C—$C_{6-10}$-aryl, and more preferably from phenyl and —C≡C-phenyl. Exemplary heteroatom-containing radicals having from 0 to 20 carbon atoms and one or more heteroatoms chosen from O, S and N include, without limitation, hydroxy, carboxy, amino, $C_{1-20}$-amido, $C_{1-10}$-alkoxy, $C_{1-20}$-hydroxyalkl, $C_{1-30}$-hydroxy(alkyleneoxy), and the like. Preferably, each $R^{10}$ is independently chosen from $C_{1-6}$-alkyl, phenyl, and substituted phenyl, more preferably each $R^{10}$ is phenyl or substituted phenyl, and yet more preferably phenyl or —$C_6H_4$—C≡C-phenyl. A wide variety of aromatic moieties are suitable for use as $Ar^3$, such as those disclosed in U.S. Pat. No. 5,965,679 (which is incorporated herein in its entirety by reference). Preferably, $Ar^3$ has from 5 to 40 carbons, and more preferably from 6 to 30 carbons. Preferred aryl moieties useful for $Ar^3$ include pyridyl, phenyl, naphthyl, anthracenyl, phenanthryl, pyrenyl, coronenyl, tetracenyl, pentacenyl, tetraphenyl, benzotetracenyl, triphenylenyl, perylenyl, biphenyl, binaphthyl, diphenyl ether, dinaphthyl ether, and those having the structure shown in formula (2)

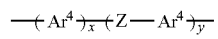

wherein x is an integer chosen from 1, 2 or 3; y is an integer chosen from 0, 1, or 2; each $Ar^4$ is independently chosen from

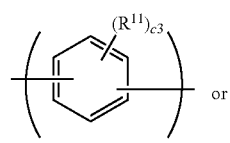

(4)

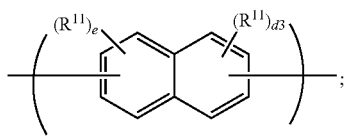

each $R^{11}$ is independently chosen from halogen, $C_{1-6}$-alkyl, $C_{1-6}$-haloalkyl, $C_{1-6}$-alkoxy, $C_{1-6}$-haloalkoxy, phenyl, and phenoxy; c3 is an integer from 0 to 4; each of d3 and e is an integer from 0 to 3; each Z is independently chosen from a single covalent chemical bond, O, S, $NR_{12}$, $PR^{12}$, $P(=O)R^{12}$, $C(=O)$, $C(R^{13})(R^{14})$, and $Si(R^{13})(R^{14})$; $R^{12}$, $R^{13}$ and $R^{14}$ are independently chosen from H, $C_{1-4}$-alkyl, $C_{1-4}$-haloalkyl, and phenyl. It is preferred that x is 1 or 2, and more preferably 1. It is preferred that y is 0 or 1, and more preferably 1. Preferably, each $R^{11}$ is independently chosen from halogen, $C_{1-4}$-alkyl, $C_{1-4}$-haloalkyl, $C_{1-4}$-alkoxy, $C_{1-4}$-haloalkoxy, and phenyl, and more preferably from fluoro, $C_{1-4}$-alkyl, $C_{1-4}$-fluoroalkyl, $C_{1-4}$-alkoxy, $C_{1-4}$-fluoroalkoxy, and phenyl. It is preferred that c3 is from 0 to 3, more preferably from 0 to 2, and yet more preferably 0 or 1. It is preferred that each of d3 and e is independently 0 to 2, and more preferably 0 or 1. In formula (4), it is preferred that d3+e=0 to 4, and more preferably 0 to 2. Each Z is preferably independently chosen from O, S, $NR^{12}$, $C(=O)$, $C(R^{13})(R^{14})$, and $Si(R^{13})(R^{14})$, more preferably from O, S, $C(=O)$, and $C(R^{13})(R^{14})$, and yet more preferably from O, $C(=O)$, and $C(R^{13})(R^{14})$. It is preferred that each $R^{12}$, $R^{13}$, and $R^{14}$ are independently chosen from H, $C_{1-4}$-alkyl, $C_{1-4}$-fluoroalkyl, and phenyl; and more preferably from H, $C_{1-4}$-alkyl, $C_{1-2}$-fluoroalkyl, and phenyl. Preferably, the aryl moiety of $Ar^3$ has at least one ether linkage, more preferably at least one aromatic ether linkage, and even more preferably one aromatic ether linkage. It is preferred that $Ar^3$ has the structure of formula (2). Preferably, each $Ar^4$ has the formula (3), and more preferably each $Ar^4$ has the formula 3 and Z is O.

Any compound having an aryl moiety and two or more alkynyl groups capable of undergoing a Diels-Alder reaction may suitably be used as the second monomer to prepare the present polymers. Preferably, the second monomer has an aryl moiety substituted with two or more alkynyl groups. It is preferred that a compound having an aryl moiety substituted with two to four, and more preferably two or three, alkynyl moieties is used as the second monomer. Preferably, the second monomers have an aryl moiety substituted with two or three alkynyl groups capable of undergoing a Diels-Alder reaction. Suitable second monomers are those of formula (5)

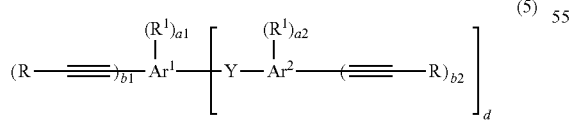

(5)

wherein each $Ar^1$ and $Ar^2$ is independently a $C_{5-30}$-aryl moiety; each R is independently chosen from H, and optionally substituted $C_{5-30}$-aryl; each $R^1$ is independently chosen from —OH, —$CO_2H$, $C_{1-10}$-alkyl, $C_{1-10}$-haloalkyl, $C_{1-10}$-hydroxyalkyl, $C_{2-10}$-carboxyalkyl, $C_{1-10}$-alkoxy, CN, and halo; each Y is independently a single covalent chemical bond or a divalent linking group chosen from —O—, —S—, —S(=O)—, —S(=O)$_2$—, —C(=O)—, —(C($R^9$)$_2$)$_z$—, $C_{6-30}$-aryl, and —(C($R^9$)$_2$)$_{z1}$—($C_{6-30}$-aryl)-(C($R^9$)$_2$)$_{z2}$—; each $R^9$ is independently chosen from H, hydroxy, halo, $C_{1-10}$-alkyl, $C_{1-10}$-haloalkyl, and $C_{6-30}$-aryl; a1=0 to 4; each a2=0 to 4; b1=1 to 4; each b2=0 to 2; a1+each a2=0 to 6; b1+each b2=2 to 6; d=0 to 2; z=1 to 10; z1=0 to 10; z2=0 to 10; and z1+z2=1 to 10. Each R is preferably independently chosen from H and $C_{6-20}$-aryl, more preferably from H and $C_{6-10}$ aryl, and yet more preferably from H and phenyl. It is preferred that each $R^1$ is independently chosen from $C_{1-10}$-alkyl, $C_{1-10}$-haloalkyl, $C_{1-10}$-hydroxyalkyl, $C_{1-10}$-alkoxy, and halo, and more preferably from $C_{1-10}$-alkyl, $C_{1-10}$-haloalkyl, and halo. Preferably, each Y is independently a single covalent chemical bond or a divalent linking group chosen from —O—, —S—, —S(=O)—, —S(=O)$_2$—, —C(=O)—, —(C($R^9$)$_2$)$_z$—, and $C_{6-30}$-aryl, and more preferably a single covalent chemical bond, —O—, —S—, —S(=O)—, —C(=O)—, and —(C($R^9$)$_2$)$_z$—. Each $R^9$ is preferably independently H, halo, $C_{1-10}$-alkyl, $C_{1-10}$-haloalkyl, or $C_{6-30}$-aryl, and more preferably fluoro, $C_{1-6}$-alkyl, $C_{1-6}$-fluoroalkyl, or $C_{6-20}$-aryl. Preferably, a1=0 to 3, and more preferably 0 to 2. It is preferred that each a2=0 to 2. Preferably, a1+a2=0 to 4, more preferably 0 to 3, and yet more preferably 0 to 2. It is preferred that b1=1 to 3, and more preferably 1 or 2. It is preferred that each b2=0 to 2; and more preferably 0 or 1. Preferably, b1+each b2=2 to 4, and more preferably 2 or 3. It is preferred that d=0 or 1, and more preferably 0. Preferably, z=1 to 6, more preferably 1 to 3, and even more preferably z=1. Preferably, z1 and z2 are each 0 to 5. It is preferred that z1+z2=1 to 6, and more preferably 2 to 6.

Suitable aryl moieties for $Ar^1$ and $Ar^2$ include, but are not limited to, pyridyl, phenyl, naphthyl, anthracenyl, phenanthryl, pyrenyl, coronenyl, tetracenyl, pentacenyl, tetraphenyl, benzotetracenyl, triphenylenyl, perylenyl, biphenyl, binaphthyl, diphenyl ether, dinaphthyl ether, carbazole, and fluorenyl. It is preferred that $Ar^1$ and each $Ar^2$ in formula (5) are independently a $C_{6-20}$ aryl moiety. Preferred aryl moieties for $Ar^1$ and each $Ar^2$ are phenyl, naphthyl, anthracenyl, phenanthryl, pyrenyl, tetracenyl, pentacenyl, tetraphenyl, triphenylenyl, and perylenyl.

Preferred second monomers of formula (5) are those of Formulas (6) and (7):

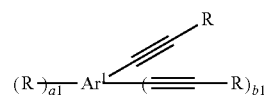

(6)

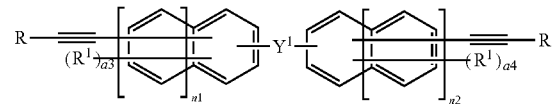

(7)

wherein $Ar^1$, R, $R^1$, a1 and b1 are as defined above for formula (5); a3 is 0 or 2; a4 is 0 to 2; each of n1 and n2 is independently 0 to 4; and Y' is a single covalent chemical bond, O, S, S(=O)$_2$, C(=O), C(CH$_3$)$_2$, CF$_2$, and C(CF$_3$)$_2$. It will be appreciated by those skilled in the art that the brackets ("[ ]") in formula (7) refer to the number of aromatic rings fused to the phenyl ring. Accordingly, when n1 (or n2)=0, the aromatic moiety is phenyl; when n1 (or n2)=1, the aromatic moiety is naphthyl; when n1 (or n2)=2, the aromatic moiety may be anthracenyl or phenanthryl;

when n1 (or n2)=3, the aromatic moiety may be tetracenyl, tetraphenyl, triphenylenyl, or pyrenyl; and when n1 (or n2)=4, the aromatic moiety may be perylenyl or benzotetracenyl. In formula (6), a1 is preferably 0 to 2, and more preferably 0. It is preferred that b1 in formula (6) is 1 or 2. R is preferably H or phenyl. Each $R^1$ in each of Formulas (6) and (7) is preferably independently chosen from $C_{1-10}$-alkyl, $C_{1-10}$-haloalkyl, $C_{1-10}$-hydroxyalkl, $C_{1-10}$-alkoxy, and halo, and more preferably from $C_{1-10}$-alkyl, $C_{1-10}$-haloalkyl, and halo. $Ar^1$ in formula (6) is preferably phenyl, naphthyl, anthracenyl, pyrenyl, and perylenyl, more preferably phenyl, naphthyl and pyrenyl, and even more preferably phenyl. In formula (7), it is preferred that n1 and n2 are independently chosen from 0, 1, 3, and 4, more preferably from 0, 1 and 3, and even more preferably from 1 and 3. It is further preferred that n1=n2. In formula (7), $Y^1$ is preferably a single covalent chemical bond, O, $S(=O)_2$, $C(=O)$, $C(CH_3)_2$, $CF_2$, or $C(CF_3)_2$, and more preferably a single covalent chemical bond.

Particularly preferred monomers of formula (6) are monomers of Formulas (8) to (12):

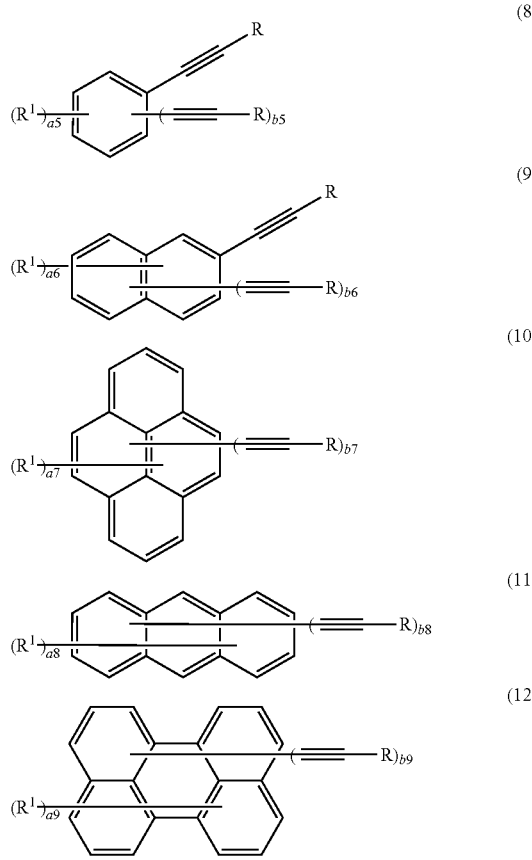

wherein R and $R^1$ are as described above for formula (6); a5=0 to 2; each of a6, a7, a8 and a9 are independently 0 to 4; b5 and b6 are each chosen from 1 to 3; and b7, b8, and b9 are each chosen from 2 to 4. Preferably, a5=0 or 1, and more preferably 0. It is preferred that a6 is 0 to 3, more preferably 0 to 2, and even more preferably 0. Preferably, each of a7 to a9 is independently 0 to 3, and more preferably 0 to 2. It is preferred that b5 and b6 are each chosen from 1 and 2. Preferably, b7, b8, and b9 are each 2 or 3. Compound (8) is more particularly preferred. Preferably, in compound (8), each R is independently H or phenyl, and more preferably each R is H or phenyl. More preferably, each $R^1$ in Formulas (8) to (12) is independently chosen from $C_{1-10}$-alkyl, $C_{1-10}$-haloalkyl, $C_{1-10}$-hydroxyalkl, $C_{1-10}$-alkoxy, and halo, and more preferably from $C_{1-10}$-alkyl, $C_{1-10}$-haloalkyl, and halo.

In the monomers of Formulas (5) to (12), any two alkynyl moieties may have an ortho-, meta- or para-relationship to each other, and preferably a meta- or para-relationship to each other. Preferably, the alkynyl moieties in the monomers of Formulas (5) to (12) do not have an ortho-relationship to each other. Suitable monomers of Formulas (5) to (12) are commercially available or may be readily prepared by methods known in the art.

Exemplary second monomers include, without limitation: 1,3-diethynylbenzene; 1,4-diethynylbenzene; 4,4'-diethynyl-1,1'-biphenyl; 3,5-diethynyl-1,1'-biphenyl; 1,3,5-triethynylbenzene; 1,3-diethynyl-5-(phenylethynyl)benzene; 1,3-bis(phenylethynyl)benzene; 1,4-bis(phenylethynyl)benzene; 1,3,5-tris(phenylethynyl)benzene; 2,4,6-tris(phenylethynyl)anisole; 4,4'-bis(phenylethynyl)-1,1'-biphenyl; 4,4'-diethynyl-diphenylether; and mixtures thereof. More preferably, the monomers of formula (5) are chosen from: 1,3-diethynylbenzene; 1,4-diethynylbenzene; 1,3,5-triethynylbenzene; 1,3,5-tris-(phenylethynyl)benzene; 4,4'-diethynyl-1, 1 '-biphenyl; 1,3-bis(phenylethynyl)-benzene; 1,4-bis (phenylethynyl)benzene; 4,4'-bis(phenylethynyl)-1,1'-biphenyl; and mixtures thereof. Even more preferably, the second monomers are chosen from: 1,3-diethynylbenzene; 1,4-diethynylbenzene; 4,4'-diethynyl-1,1'-biphenyl; 1,3,5-triethynylbenzene; 1,3,5-tris(phenylethynyl)benzene; and mixtures thereof.

The present polyarylene ethers may optionally further include as polymerized units one or more end-capping monomers. Preferably, only one end-capping monomer is used. As used herein, the term "end-capping monomer" refers to monomers having a single dienophilic moiety, where such dienophilic moiety functions to cap one or more ends of the present polymers such that capped ends of the polymers are incapable of further Diels-Alder polymerization. Preferably, the dienophilic moiety is an alkynyl moiety. Optionally, the end-capping monomer may include one or more solubility enhancing polar moieties, such as those disclosed in U.S. Published Pat. App. No. 2016/0060393 (which is incorporated herein in its entirety by reference). It is preferred that the end-capping monomers are free of solubility enhancing polar moieties. Preferred end-capping monomers are those of formula (13)

wherein $R^{20}$ and $R^{21}$ are each independently chosen from H, optionally substituted $C_{1-10}$ alkyl, optionally substituted $C_{7-12}$ arylalkyl, or optionally substituted $C_{6-10}$ aryl. In some aspects, $R^{21}$ may be a polar moiety. Suitable polar moieties are any hydrocarbyl moiety having from 1 to 20 carbon atoms and one or more functional groups chosen from —C(O)—$R^{130}$, —C(O)O$R^{130}$, —OH, —NO$_2$, and —N$R^{130}R^{131}$, where $R^{130}$ and $R^{131}$ are each independently chosen from H, $C_{1-10}$ alkyl, $C_{7-16}$ arylalkyl, and $C_{6-10}$ aryl. Preferably, the polar moiety is chosen from —C(O)—$R^{130}$, —C(O)O$R^{130}$, —OH, and —N$R^{130}R^{131}$, and more preferably from —C(O)—$R^{130}$, —C(O)O$R^{130}$, and —OH. Such —C(O)—, —OH, and —N$R^{130}R^{131}$ functional groups may be part of another functional group, as in carboxylic acids, anhydrides, amides, ketones, esters, and the like. It is preferred that the polar moiety is chosen from carboxyl, $C_{2-12}$ aliphatic carboxylate, $C_{1-10}$ hydroxyalkyl, $C_{6-10}$ hydroxyaryl, $C_{7-20}$ aryl carboxylic acid, $C_{8-20}$-aryl carboxylic acid anhydride, $C_{7-20}$ aryl carboxylate, $C_{7-20}$ aryl amide, $C_{8-20}$ aryl imide, $C_{1-10}$ aminoalkyl, and $C_{6-20}$ arylamine. More preferably, the polar moiety is chosen from carboxyl, $C_{2-12}$ aliphatic carboxylate, $C_{1-10}$ hydroxyalkyl, $C_{6-10}$ hydroxyaryl, $C_{7-16}$ aryl carboxylic acid, and $C_{8-16}$ aryl carboxylic acid anhydride. Other end capping monomers include alkene compounds. When employed, end-capping monomers are typically used in a molar ratio of 1:0.01 to 1:1.2 of first monomer to end-capping monomer.

Exemplary end capping monomers include, but are not limited to styrene; α-methylstyrene; β-methylstyrene; norbornadiene; ethynylpyridine; ethynylbenzene; ethynylnaphthylene; ethynylpyrrene; ethynylanthracene; ethynylphenanthrene; diphenylacetylene; acetylenedicarboxylic acid; ethynylphenol; 4-ethynyl-1,1'-biphenyl; 1-propynylbenzene; propiolic acid; acetylene dicarboxylic acid; phenyl propiolic acid; ethynyl benzoic acid; ethynyl phthalic acid; propargyl alcohol; propargylamine; 2-butyn-1,4-diol; 2-methyl-3-butyn-2-ol; 3-butyn-1-ol; 3-butyn-2-ol; 2-butyn-1-ol; 2-butynoic acid; ethynyl phenol; xylityl propiolate; ethynyl phthalic anhydride; ethynyl phthalimide; ethynyl benzamide; 2-butyn-1,4-diol diacetate; 3-butyn-2-one; 1-ethynyl-1-cyclohexanol; 1-ethynylcyclohexylamine; 1-ethynylcyclopentanol; ethynylaniline; N-(ethynylphenyl) acetamide; 2-carbamoyl-5-ethynylbenzoic acid; ethynyl-nitrobenzene; propiolamide; N-hydroxyl-propiolamide; 2-aminobut-3-ynoic acid; and mixtures thereof. Preferred end capping monomers are ethynylbenzene, norbornadiene; ethynylnaphthylene, ethynylpyrrene, ethynylanthracene, ethynylphenanthrene, and 4-ethynyl-1,1'-biphenyl.

The poly(arylene ethers) may be prepared by a Diels-Alder polymerization of one or more first monomers and one or more second monomers, and any optional end capping monomers in a suitable organic solvent. The total moles of second monomers used are greater than the total moles of first monomers used. The mole ratio of the total first monomers to the total second monomers is typically from 1:1.01 to 1:1.5, preferably from 1:1.05 to 1:1.4, more preferably from 1:1.1 to 1:1.3, yet more preferably from 1:1.15 to 1:1.3, and even more preferably from 1:1.2 to 1:1.3. The ratio of the total moles of first monomer to total moles of second monomer are typically calculated as the feed ratio of the monomers, but may also be determined using conventional matrix-assisted laser desorption/ionization (MALDI) time-of-flight (TOF) mass spectrometry, with silver trifluoroacetate being added to the samples to facilitate ionization. A suitable instrument is a Bruker Daltonics ULTRAFLEX MALDI-TOF mass spectrometer equipped with a nitrogen laser (337 nm wavelength).

Suitable organic solvents useful to prepare the present polymers are benzyl esters of ($C_2$-$C_6$)alkanecarboxylic acids, dibenzyl esters of ($C_2$-$C_6$)alkanedicarboxylic acids, tetrahydrofurfuryl esters of ($C_2$-$C_6$)alkanecarboxylic acids, ditetrahydrofurfuryl esters of ($C_2$-$C_6$)alkanedicarboxylic acids, phenethyl esters of ($C_2$-$C_6$)alkanecarboxylic acids, diphenethyl esters of ($C_2$-$C_6$)alkanedicarboxylic acids, aromatic ethers, N-methyl pyrrolidone (NMP), and gamma-butyrolactone (GBL). Preferred aromatic ethers are diphenyl ether, dibenzyl ether, ($C_1$-$C_6$)alkoxy-substituted benzenes, benzyl ($C_1$-$C_6$)alkyl ethers, NMP and GBL, and more preferably ($C_1$-$C_4$)alkoxy-substituted benzenes, benzyl ($C_1$-$C_4$) alkyl ethers, NMP, and GBL. Preferred organic solvents are benzyl esters of ($C_2$-$C_4$)alkanecarboxylic acids, dibenzyl esters of ($C_2$-$C_4$)alkanedicarboxylic acids, tetrahydrofurfuryl esters of ($C_2$-$C_4$)alkanecarboxylic acids, ditetrahydrofurfuryl esters of ($C_2$-$C_4$)alkanedicarboxylic acids, phenethyl esters of ($C_2$-$C_4$)alkanecarboxylic acids, diphenethyl esters of ($C_2$-$C_4$)alkanedicarboxylic acids, ($C_1$-$C_6$)alkoxy-substituted benzenes, benzyl ($C_1$-$C_6$)alkyl ethers, NMP, and GBL, more preferably benzyl esters of ($C_2$-$C_6$)alkanecarboxylic acids, tetrahydrofurfuryl esters of ($C_2$-$C_6$)alkanecarboxylic acids, phenethyl esters of ($C_2$-$C_6$)alkanecarboxylic acids, ($C_1$-$C_4$)alkoxy-substituted benzenes, benzyl ($C_1$-$C_4$)alkyl ethers, dibenzyl ether, NMP, and GBL, and yet more preferably benzyl esters of ($C_2$-$C_6$)alkanecarboxylic acids, tetrahydrofurfuryl esters of ($C_2$-$C_6$)alkanecarboxylic acids, ($C_1$-$C_4$)alkoxy-substituted benzenes, benzyl ($C_1$-$C_4$)alkyl ethers, NMP, and GBL. Exemplary organic solvents include, without limitation, benzyl acetate, benzyl propionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, benzyl methyl ether, and benzyl ethyl ether, and preferably benzyl acetate, benzyl propionate, tetrahydrofurfuryl acetate, tetrahydrofurfuryl propionate, tetrahydrofurfuryl butyrate, anisole, methylanisole, dimethylanisole, dimethoxybenzene, ethylanisole, and ethoxybenzene.

The poly(arylene ether)s, according to an embodiment, may be prepared by combining the first monomer, the second monomer, any optional end capping monomer, and organic solvent, each as described above, in any order in a vessel and heating the mixture. Preferably, the present polymers are prepared by combining the first monomer, the second monomer, and organic solvent, each as described above, in any order in a vessel and heating the mixture. Alternatively, the first monomer may first be combined with the organic solvent in a vessel, and the second monomer then added to the mixture. In one alternate embodiment, the first monomer and organic solvent mixture is first heated to the desired reaction temperature before the second monomer is added. The second monomer may be added at one time, or alternatively, may be added over time, such as from 0.25 to 6 hours, to reduce exotherm formation. The first monomer and organic solvent mixture may first be heated to the desired reaction temperature before the second monomer is added. The present end-capped polyarylene ethers may be prepared by first preparing a polyarylene ether by combining the first monomer, the second monomer, and organic solvent in any order in a vessel and heating the mixture, followed by isolating the polyarylene ether, and then combining the isolated polyarylene ether with an end-capping monomer in an organic solvent and heating the mixture for a period of time. Alternatively, the present end-capped polyarylene ethers may be prepared by combining the first monomer, the second monomer, and organic solvent in any order in a vessel and heating the mixture for a period of time to provide the desired polyarylene ether, and then adding the end-capping monomer to the reaction mixture containing the polyarylene ether and heating the reaction mixture for a period of time. The reaction mixture is heated at a temperature from 100 to 250° C. Preferably, the mixture is heated to a temperature from 150 to 225° C., and more preferably to a temperature from 175 to 215° C. Typically, the reaction is allowed to proceed from 2 to 20 hours, preferably from 2 to 8 hours, and more preferably from 2 to 6 hours, with shorter reaction times yielding relatively lower molecular weight polyarylene ethers. The reaction may be performed in an oxygen-containing atmosphere, but an inert atmosphere such as nitrogen is preferred. Following the reaction, the resulting poly(arylene ether)s may be isolated from the reaction mixture or used as is for coating a substrate.

While not intending to be bound by theory, it is believed that the present poly(arylene ether)s are formed through the Diels-Alder reaction of the cyclopentadienone moieties of the first monomer with the alkynyl moieties of the second monomer upon heating. During such Diels-Alder reaction, a carbonyl-bridged species forms. It will be appreciated by those skilled in the art that such carbonyl-bridged species may be present in the polymers. Upon further heating, the carbonyl bridging species will be essentially fully converted to an aromatic ring system. Due to the mole ratio of the monomers used, the present polymers contain arylene rings in the poly(arylene ether) backbone.

Exemplary poly(arylene ether) compounds include the following:

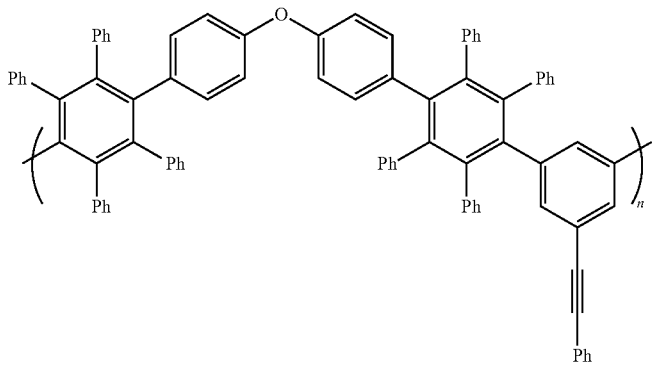

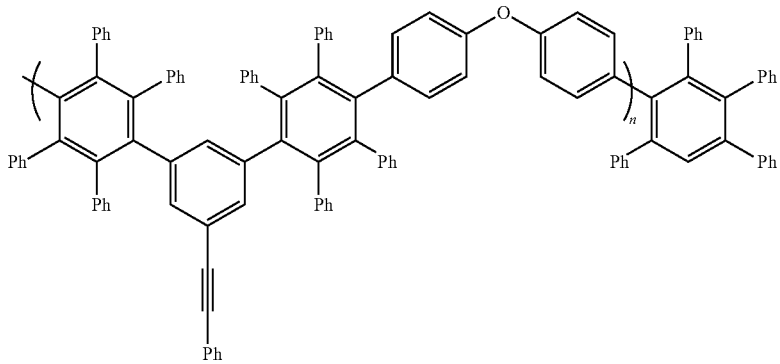

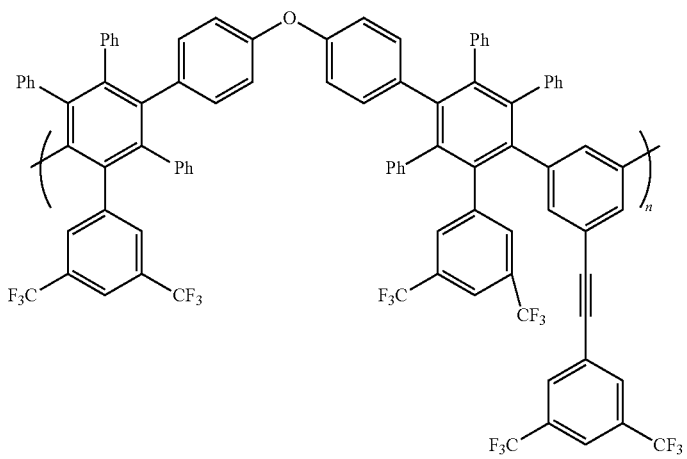

-continued

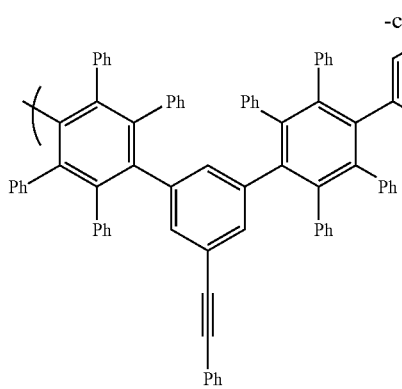
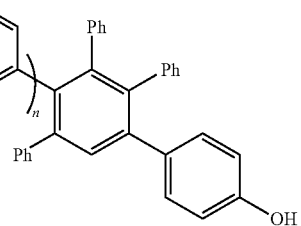

wherein Ph is phenyl and n is an integer from 1 to 100, preferably from 2 to 50, more preferably from 2 to 10.

To increase polymer solubility, the one or more first monomers and/or the one or more second monomers may be substituted with polar moieties, such as those solubility enhancing moieties disclosed in U.S. Published Pat. App. No. 2017/0009006 (which is incorporated herein in its entirety by reference). Suitable solubility enhancing polar moieties include, without limitation: hydroxyl, carboxyl, thiol, nitro, amino, amido, sulfonyl, sulfonamide moieties, ester moieties, quaternary amino moieties, and the like. Exemplary first monomers having one or more solubility enhancing polar moieties are disclosed in U.S. patent application Ser. No. 15/790,606, filed on Oct. 27, 2017 (which is incorporated herein in its entirety by reference). Exemplary second monomers having one or more solubility enhancing polar moieties are those disclosed in U.S. Published Pat. App. No. 2017/0009006 (which is incorporated herein in its entirety by reference). Preferably, the one or more first monomers are free of solubility enhancing polar moieties. Preferably, the one or more second monomers are free of solubility enhancing polar moieties. More preferably, both the more first monomers and second monomers are free of solubility enhancing polar moieties.

The poly(arylene ether) typically has a weight average molecular weight ($M_w$) of 1,000 to 100,000 Dalton (Da), preferably from 1,000 to 50,000 Da, more preferably from 2,000 to 10,000 Da, yet more preferably from 2,500 to 5,000 Da, even more preferably from 2,700 to 5,000 Da, and still more preferably from 3,000 to 5,000 Da. The poly(arylene ether) typically has a number average molecular weight ($M_n$) in the range of 1,500 to 50,000 Da. The poly(arylene ether) has a polydispersity index (PDI) of 1 to 5, preferably from 1 to 3, more preferably from 1 to 2, yet more preferably from 1 to 1.9, and still more preferably from 1.25 to 1.75. The $M_n$ and $M_w$ of the present polymers are determined by the conventional technique of gel permeation chromatography (GPC) against polystyrene standards using uninhibited tetrahydrofuran (THF) as eluting solvent at 1 mL/min and a differential refractometer detector. The present poly(arylene ether) has a degree of polymerization (DP) in the range of from 1 to 100, preferably from 2 to 50, more preferably from 2 to 10, and yet more preferably from 2 to 5. DP is calculated by dividing the molecular weight of the polymer by the molecular weight of the respective repeating unit, exclusive of any end capping monomer present. Particularly preferred poly(arylene ether)s, according to an embodiment, are those having a $M_w$ of 3,000 to 5,000 Da, a PDI from 1.25 to 1.75, and a ratio of total moles of first monomer to total moles of second monomer from 1:1.2 to 1:1.3.

Examples of commercially available poly(arylene ether)s include SILK semiconductor dielectric (from The Dow Chemical Company), FLARE dielectric (from Allied Signal, Inc.), and VELOX (poly(arylene ether)) (from AirProducts/Shumacher). A preferred class of poly(arylene ether) polymers is a thermosettable mixture or b-staged product of a poly(cyclopentadienone) and a poly(acetylene), such as those described in WO 98/11149, which teachings are incorporated herein by reference. Examples of precursors that may be used to prepare the poly(arylene ether)s of this invention include monomers such as aromatic compounds substituted with ethynylic groups ortho to one another on the aromatic ring as shown in WO 97/10193, incorporated herein by reference; cyclopentadienone functional compounds combined with aromatic acetylene compounds as shown in WO 98/11149, incorporated herein by reference; and the polyarylene ethers of U.S. Pat. Nos. 5,115,082; 5,155,175; 5,179,188; 5,874,516; 5,965,679 and in PCT WO 91/09081; WO 97/01593 and EP 0755957-81, each of which is incorporated herein by reference.

When the poly(arylene ether) comprises a thermosettable mixture or b-staged product of a poly(cyclopentadienone) and a poly(acetylene), the precursors preferably are characterized so that branching occurs relatively early during the curing process. Formation of a branched matrix early on in the cure process minimizes the modulus decrease of the matrix, and helps to minimize pore collapse during the cure process, and/or allows for the use of poragens that decompose or degrade at lower temperatures. One approach for achieving this is to use a ratio of cyclopentadienone functionality to acetylene functionality in the precursor composition of greater than about 3:4, and preferably less than about 2:1, more preferably about 1:1. The poly(arylene ether) prepared from a curable mixture comprising of 3 parts 3,3'-(oxydi-1,4-phenylene)bis(2,4,5-triphenycyclpentadienone) (DPO-CPD) and 2 parts 1,3,5-tris(phenylethynyl) benzene (TRIS) (molar ratios) is an example of such a system. Alternatively, additional reagents capable of crosslinking the thermosettable mixture or b-staged product of a poly(cyclopentadienone) and a poly(acetylene) can be added to minimize the modulus loss of the poly(arylene ether) during the cure process. Examples of suitable reagents include bis-orthodiacetylenes as disclosed, for example, in WO 97/10193, incorporated herein by reference; monoorthodiacetylenes; bis-triazenes; tetrazines, such as 1,3-diphenyltetrazine; bisazides, such as bis-sulfonylazides; and peroxides, such as diperoxides.

The poly(arylene ether) is typically present in the photoresist underlayer composition in an amount from 10 to 99.9 wt %, typically from 25 to 99 wt %, and more typically from 50 to 99 wt %, based on total solids of the photoresist underlayer composition.

The additive of formula (14) is a compound of the structure:

  (14)

wherein each Ar is independently a monocyclic or polycyclic $C_{5-60}$ aromatic group; m is an integer of 1 to 6; and each n is independently an integer of 0 to 5, provided that the sum of n is 2 or greater.

In an embodiment, the monocyclic or polycyclic $C_{5-60}$ aromatic group may be a monocyclic or polycyclic $C_{6-60}$ arylene group or a monocyclic or polycyclic $C_{5-60}$ heteroarylene group. When the $C_{5-60}$ aromatic group is polycyclic, the ring or ring groups can be fused (such as naphthyl or the like), directly linked (such as biaryls, biphenyl, or the like), and/or bridged by a heteroatom (such as triphenylamino or diphenylene ether). In an embodiment, the polycyclic aromatic group may include a combination of fused and directly linked rings (such as binaphthyl or the like). For convenience, the monocyclic or polycyclic $C_{5-60}$ aromatic group can be referred to herein as "the Ar group."

In addition to the substituent groups X, each of the monocyclic or polycyclic $C_{5-60}$ aromatic groups may be further substituted. Exemplary substituents include, but are not limited to, substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, or a halogen.

It is to be understood that when the "monocyclic or polycyclic $C_{6-60}$ arylene group" is polycyclic, the number of carbon atoms is enough for the group to be chemically feasible. For example, the "monocyclic or polycyclic $C_{6-60}$ arylene group" may refer to "a monocyclic $C_{6-60}$ arylene group or a polycyclic $C_{10-60}$ arylene group"; or, for example "a monocyclic $C_{6-30}$ arylene group or a polycyclic $C_{12-60}$ arylene group". Similarly, when the "monocyclic or polycyclic $C_{5-60}$ heteroarylene group" is polycyclic, the number of carbon atoms is enough for the group to be chemically feasible. For example, the "monocyclic or polycyclic $C_{5-60}$ heteroarylene group" may refer to "a monocyclic $C_{5-60}$ heteroarylene group or a polycyclic $C_{10-60}$ heteroarylene group"; or, for example "a monocyclic $C_{5-30}$ heteroarylene group or a polycyclic $C_{12-60}$ heteroarylene group".

In formula (1), D is a substituted or unsubstituted $C_{1-60}$ organic group and optionally may be an organic acid salt of the substituted or unsubstituted $C_{1-60}$ organic group. Typically, D may be a polyvalent $C_{1-30}$ alkyl, a polyvalent $C_{3-30}$ cycloalkyl, a polyvalent $C_{1-20}$ heterocycloalkyl, a polyvalent $C_{6-30}$ aryl, a polyvalent $C_{6-30}$ heteroaryl, —$NH_2$ or an organic acid salt thereof, or —$C(O)OR^{22}$ wherein $R^{22}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. More preferably, D may be a polyvalent $C_{1-30}$ alkyl, a polyvalent $C_{3-30}$ cycloalkyl, a polyvalent $C_{6-30}$ aryl, or a polyvalent $C_{6-30}$ heteroaryl.

In formula (1), each $L^1$ is independently a single bond or a divalent linking group. In an aspect, when $L^1$ is a single bond, D may be a substituted or unsubstituted $C_{3-30}$ cycloalkyl or substituted or unsubstituted $C_{1-20}$ heterocycloalkyl that is optionally fused with Ar. When D is a polyvalent $C_{6-30}$ aryl or a polyvalent $C_{6-30}$ heteroaryl, and when L' is a single bond, D can together with Ar form a condensed polycyclic ring system.

Exemplary divalent linking groups include one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —$NR^{23}$—, —S—, —S(O)—, —$S(O)_2$—, or —$C(O)NR^{23}$—, wherein $R^{23}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

In some aspects, D may be a polyvalent $C_{6-30}$ aryl or a polyvalent $C_{6-30}$ heteroaryl, and when $L^1$ is a single bond, D can together with Ar form a condensed polycyclic ring system. In some aspects, D may be a fused, condensed, or spirocyclic polyvalent cycloalkyl moiety, wherein the cycloalkyl group and Ar can optionally form a fused ring.

To increase adhesion to a substrate, the additive includes at least one protected or free polar functional group X. As used herein, the term "polar functional group" refers to a functional group including at least one heteroatom. The additive may include an aromatic or heteroaromatic group having at least one protected or free functional group selected from hydroxy, thiol, and amino. The term "free functional group" as used herein refers to a non-protected functional group. Thus, the term "free hydroxy group" refers to "—OH," the term "free thiol group" refers to "—SH," and the term "free amino group" refers to "—$NH_2$." The term "protected functional group" as used herein refers to a functional group capped with a protecting group which reduces or eliminates reactivity of the free functional group. The protecting group may optionally include —O—, —NR— (wherein R is hydrogen or $C_{1-10}$ alkyl group), —C(=O)—, or a combination thereof.

The protecting group may include a formyl group, a substituted or unsubstituted linear or branched $C_{1-10}$ alkyl group, a substituted or unsubstituted $C_{3-10}$ cycloalkyl group, a substituted or unsubstituted $C_{2-10}$ alkenyl group, a substituted or unsubstituted $C_{2-10}$ alkynyl group, or a combination thereof. The protecting group may include —O—, —NR— (wherein R is hydrogen or $C_{1-10}$ alkyl group), —C(=O)—, or a combination thereof, at any portion of the protecting group.

In an embodiment, the functional group may be hydroxyl, which may be protected as an alkyl ether to form a structure $OR^{24}$, wherein $R^{24}$ is a $C_{1-10}$ linear or branched alkyl group. Preferred alkyl groups include methyl, ethyl, n-propyl, iso-propyl, n-butyl, iso-butyl, and tert-butyl groups.

In another embodiment, the protecting group may be a formyl group —C(=O)H or a $C_{2-10}$ alkanoyl group —C(=O)$R^{25}$, wherein $R^{25}$ is a $C_{1-10}$ linear or branched alkyl group]. Preferably, the $C_{2-10}$ alkanoyl group is an acetyl group —C(=O)$CH_3$ or a propionyl group —C(=O)$CH_2CH_3$. The functional group may be a hydroxy group protected with an acetyl group or a propionyl group to form an ester —OC(=O)$CH_3$ or —OC(=O)$CH_2CH_3$, respectively.

In another embodiment, the hydroxyl group may be protected as a carbonate to form a structure —OC(=O)$OR^{26}$, wherein $R^{26}$ is a $C_{1-10}$ linear or branched alkyl group. Preferred carbonate groups include —OC(=O)$OCH_3$, —OC(=O)$OCH_2CH_3$, —OC(=O)$OCH_2CH_2CH_3$, —OC(=O)$OCH(CH_3)_2$, or —OC(=O)$OC(CH_3)_3$. In another embodiment, the hydroxyl group may be protected as a carbamate to form a structure —OC(=O)$NR^{27}R^{28}$, wherein $R^{27}$ and $R^{28}$ are each independently a $C_{1-10}$ linear or branched alkyl group. Preferred carbamate groups include —OC(=O)$NHCH_3$, —OC(=O)$NHCH_2CH_3$, —OC(=O)$NHCH_2CH_2CH_3$, —OC(=O)$NHCH(CH_3)_2$, —OC(=O)$NHC(CH_3)_3$, or —OC(=O)$N(CH_3)_2$.

In an embodiment, the protecting group may be a polymerizable group which includes a substituted or unsubstituted $C_{2-10}$ alkenyl group, a substituted or unsubstituted $C_{2-10}$ alkynyl group, or a combination thereof.

In formula (14), each X is independently —$OR^{30}$, —$SR^{31}$, or —$NR^{32}R^{33}$, wherein $R^{30}$ to $R^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O)$_2$—, or —$NR^{34}$— wherein $R^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl. It is to be understood that substituent group X does not include a structure that comprises unstable chemical moieties, such as —O—O—.

In an aspect, in formula (14), each X is independently —$OR^{30}$ or —$NR^{32}R^{33}$, m is an integer of 2 to 4, and the sum of n is 3 or greater. In another aspect, in formula (1), each X is independently —$OR^{30}$, wherein each $R^{30}$ is independently hydrogen, substituted or unsubstituted $C_{1-10}$ alkyl, substituted or unsubstituted —C(O)—$C_{1-6}$ alkyl (a substituted or unsubstituted $C_{2-8}$ alkanoyl), substituted or unsubstituted $C_3$-10 cycloalkyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

In formula (14), when n is 2, optionally any one of $R^{30}$ to $R^{33}$ of a first group X is a divalent group, any one of $R^{30}$ to $R^{33}$ of a second group X is a divalent group, and the divalent group of the first group X forms a ring together with the divalent group of the second group X, wherein the ring optionally further comprises a linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{6-30}$ arylene, —O—, —C(O)—, —C(O)O—, —$NR^{35}$—, —S—, —S(O)—, or —S(O)$_2$—, wherein $R^{35}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

In some aspects, the additive may be a compound of formula (15):

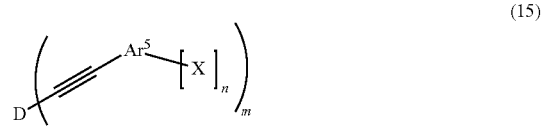

(15)

In formula (15), D is as defined above for formula (14), each $Ar^y$ is a monocyclic or polycyclic $C_{6-60}$ arylene group or a monocyclic or polycyclic $C_{5-60}$ heteroarylene group, each X is independently —$OR^{30}$, —$SR^{31}$, or —$NR^{32}R^{33}$, m is an integer of 2 to 4, each n is independently an integer of 1 to 5, provided that the sum of n is 3 or greater.

In still another aspect, in formula (14), D may be —(C(O)O$^-$)(M$^+$) or —(NH$_3^+$)(Z$^-$), wherein M$^+$ is an organic cation and Z$^-$ is an organic anion. In this aspect, each L$^1$ is independently a divalent linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{6-30}$ arylene, —O—, —C(O)—, —C(O)O—, —$NR^{36}$—, —S—, —S(O)—, —S(O)$_2$—, or —C(O)$NR^{36}$—, m is 1, each Ar is independently a monocyclic or polycyclic $C_{5-60}$ aromatic group, each X is independently —$OR^{30}$, —$SR^{31}$, or —$NR^{32}R^{33}$, n is an integer of 2 to 4, $R^{36}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl, and $R^{30}$ to $R^{33}$ are as disclosed herein.

For example, the additive compound can be of formula (16):

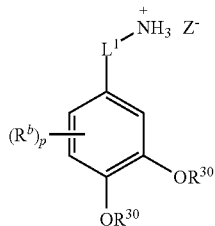

(16)

wherein Z is an organic anion, $L^1$ is a single bond or a divalent linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, —O—, —C(O)—, —C(O)O—, —NR$^{23}$—, —S—, —S(O)—, or —S(O)$_2$—, each $R^b$ is independently substituted or unsubstituted $C_{1-30}$ alkyl, substituted or unsubstituted $C_{3-30}$ cycloalkyl, substituted or unsubstituted $C_{1-30}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl, —OR$^{30}$, —SR$^{31}$, or —NR$^{32}$R$^{33}$, p is an integer of 0 to 3, and $R^{23}$ and $R^{30}$ to $R^{33}$ are the same as defined herein.

Exemplary additive compounds include the following:

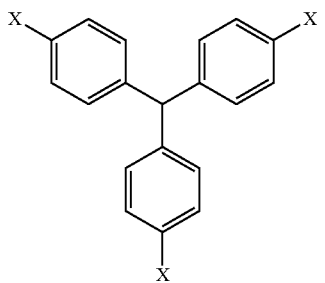

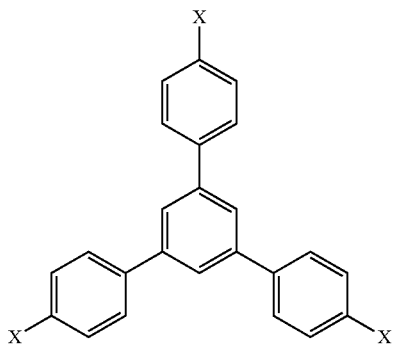

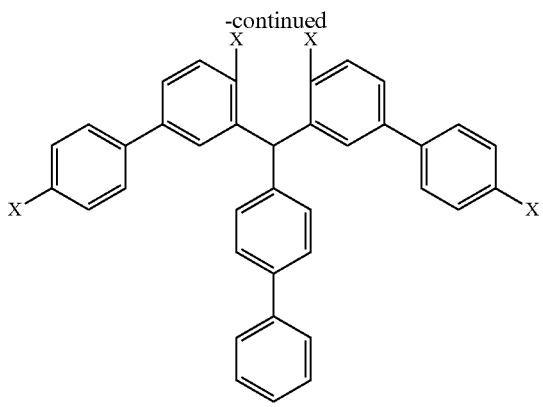

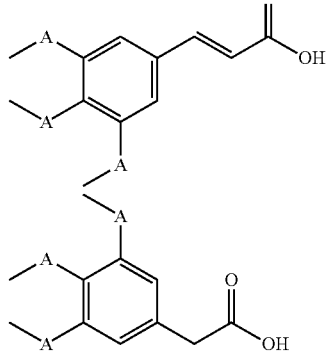

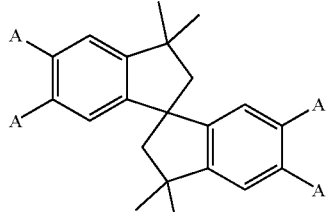

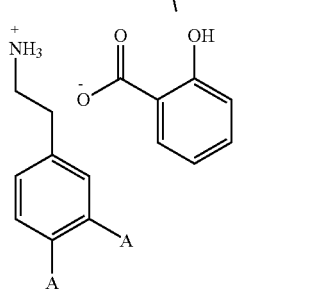

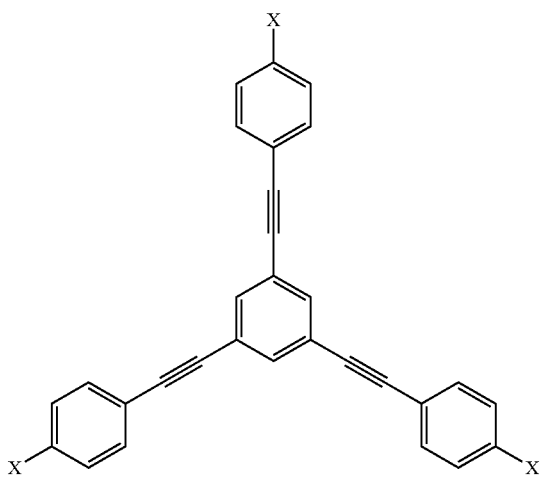

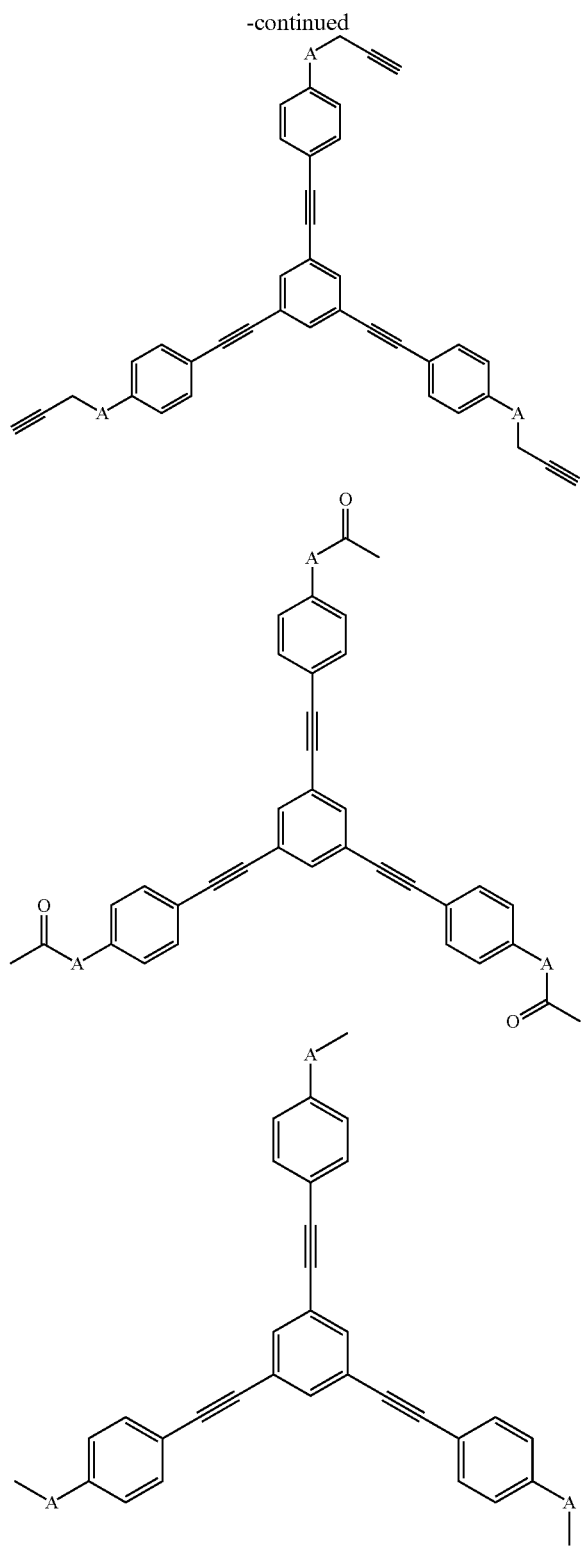

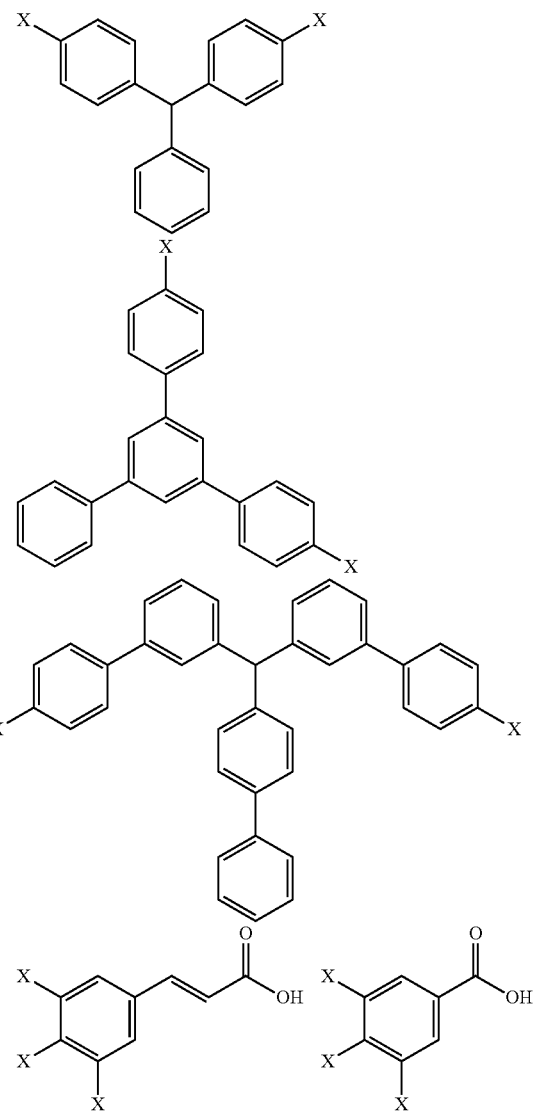

wherein X is —OR$^c$, —SR$^c$, or —NR$^d$R$^e$; A is —O—, —S—, or —NR$^d$—; and R$^c$, R$^d$, and W are each independently hydrogen, substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, or substituted or unsubstituted C$_{4-30}$ heteroarylalkyl, each of which except hydrogen optionally further comprises as part of its structure one or more of substituted or unsubstituted C$_{1-30}$ alkylene, substituted or unsubstituted C$_{3-30}$ cycloalkylene, substituted or unsubstituted C$_{2-30}$ alkenylene, substituted or unsubstituted C$_{4-30}$ cycloalkenylene, substituted or unsubstituted C$_{2-30}$ alkynylene, substituted or unsubstituted C$_{1-30}$ heterocycloalkylene, substituted or unsubstituted C$_{6-30}$ arylene, substituted or unsubstituted C$_{4-30}$ heteroarylene, —O—, —C(O)—, —C(O)O—, —S—, —S(O)—, —S(O)$_2$—, or —NR$^{37}$— wherein R$^{37}$ is substituted or unsubstituted C$_{1-30}$ alkyl, substituted or unsubstituted C$_{3-30}$ cycloalkyl, substituted or unsubstituted C$_{1-20}$ heterocycloalkyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{4-30}$ heteroaryl, substituted or unsubstituted C$_{5-30}$ heteroarylalkyl, or substituted or unsubstituted C$_{5-30}$ alkylheteroaryl.

Other exemplary additive compounds include the following:

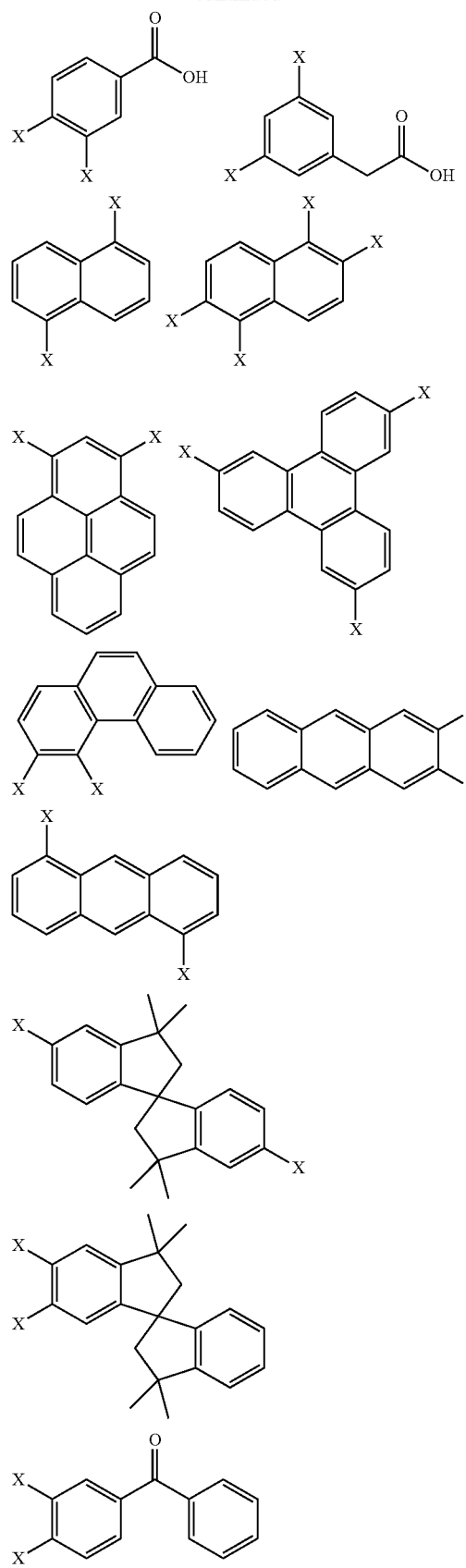
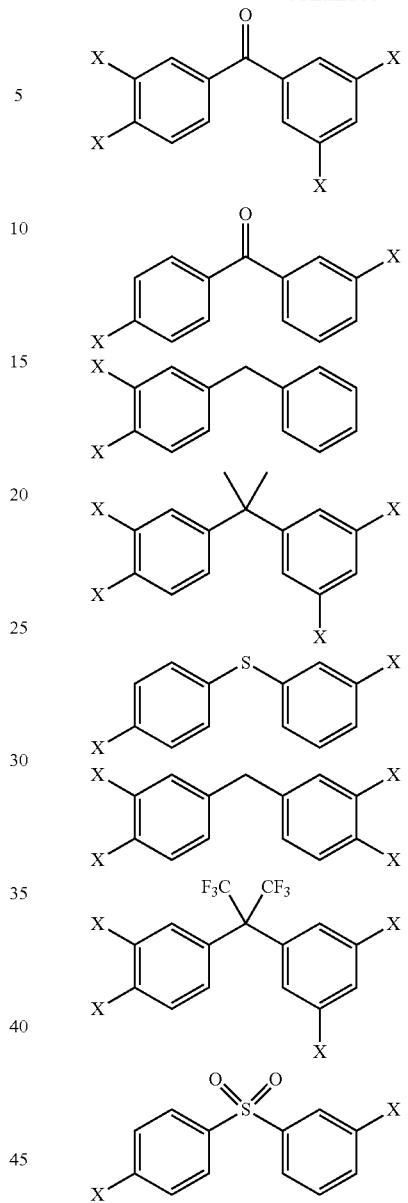
wherein X is as defined herein.
Still other exemplary additive compounds include the following:
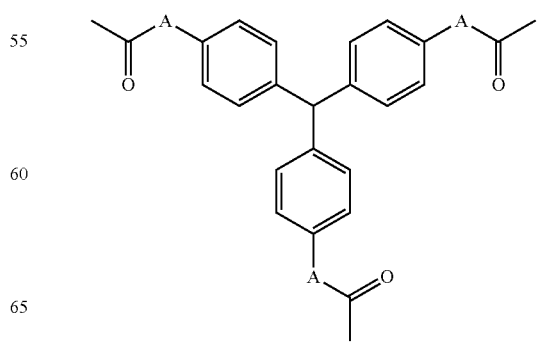

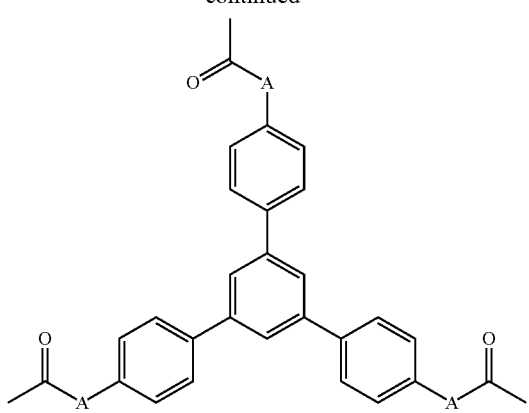
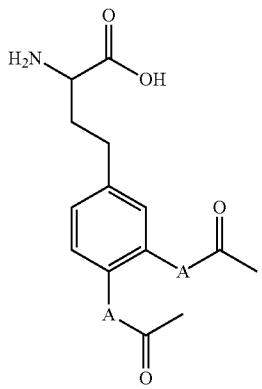
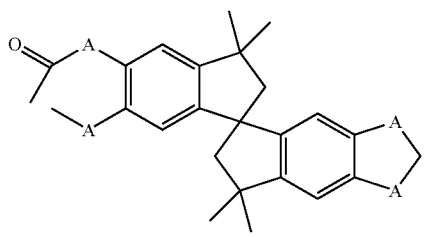
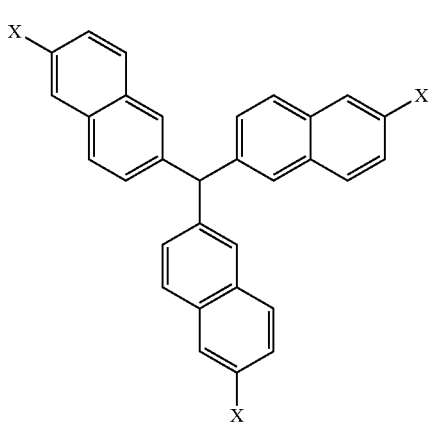
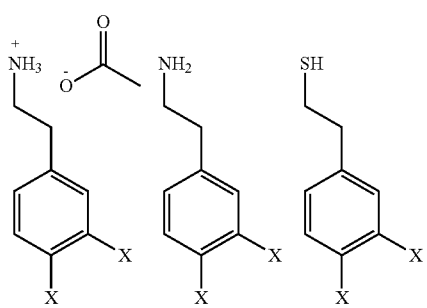
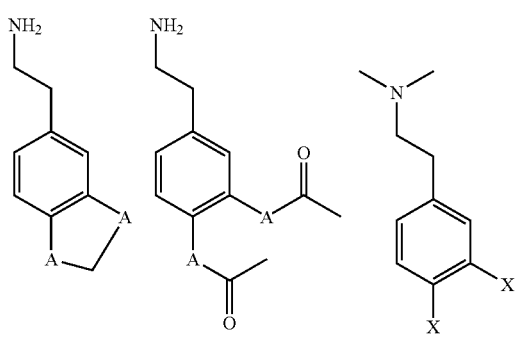
wherein A and X are as defined herein.
Still other exemplary additive compounds include the following:
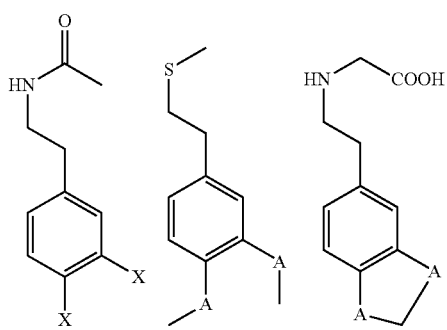
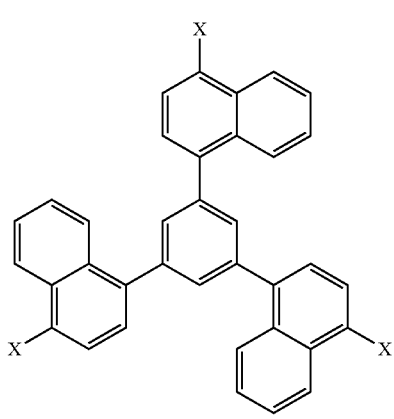

-continued

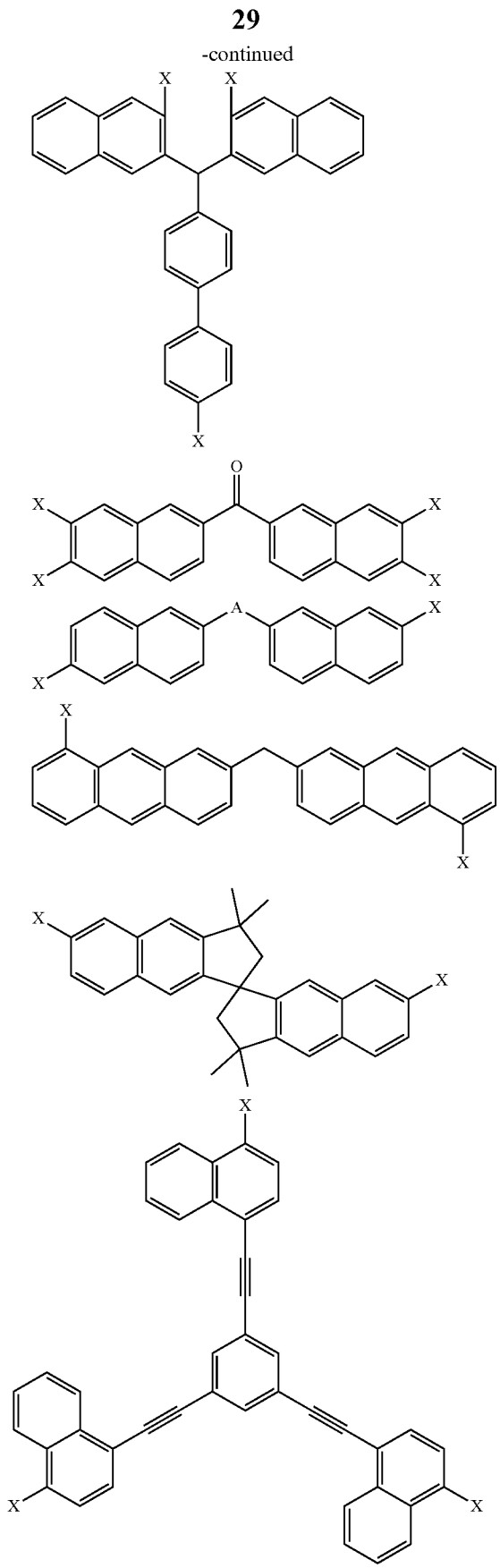

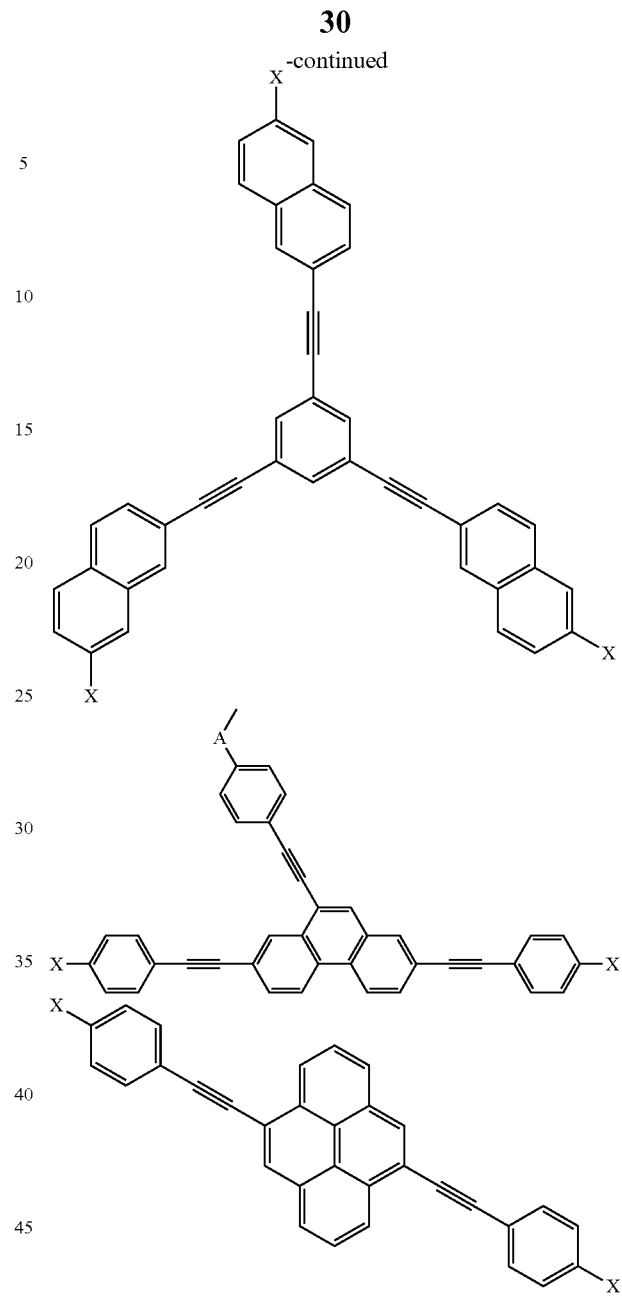

wherein A and X are as defined herein.

The additive of formula (14) is typically present in the photoresist underlayer composition in an amount from 0.1 to 20 wt %, based on total solids of the photoresist underlayer composition.

A variety of solvents may be used in the inventive photoresist underlayer composition, such as, but not limited to, alcohols, glycol ethers, lactones, esters, ethers, ketones, water, and aromatic hydrocarbons. Preferably, a relatively polar solvent is used, such as alcohols, glycol ethers, lactones, esters, ethers, ketones, or water. Mixtures of solvents may be used. Exemplary solvents include, without limitation, methanol, ethanol, propanol, propylene glycol, propylene glycol monomethyl ether (PGME), propylene glycol dimethyl ether, diethylene glycol dimethyl ether, propylene glycol monomethyl ether acetate (PGMEA), methyl 3-methoxypropionate (MMP), ethyl lactate, n-butyl acetate, anisole, N-methyl pyrrolidone (NMP), gamma-butyrolactone (GBL), gamma-valerolactone, delta-valerolactone, ethyl lactate, 1,4-dioxane, cyclohexanone, cyclopentanone, methyl ethyl ketone, water, mesitylene, xylene, anisole, 4-methylanisole, ethoxybenzene, benzyl propionate, benzyl benzoate, cyclohexanone, cyclopentanone, propylene carbonate, xylene, mesitylene, cumene, limonene, or the like, and combinations thereof. Preferred solvents are methanol, ethanol, propanol, propylene glycol, propylene glycol monomethyl ether, propylene glycol dimethyl ether, propylene glycol monomethyl ether acetate, gamma-butyrolactone, gamma-valerolactone, delta-valerolactone, ethyl lactate, 1,4-dioxane, cyclohexanone, and water. When a mixture of solvents is used, the ratio of solvents is generally not critical and may vary from 99:1 to 1:99 weight-to-weight (w/w), provided that the solvent mixture is able to dissolve the components of the composition. It will be appreciated by those skilled in the art that the concentration of the components in the organic solvent may be adjusted by removing a portion of the organic solvent or by adding more of the organic solvent, as may be desired.

The photoresist underlayer composition may include optional additives, such as curing agents, cross-linking agents, surface leveling agents, or any combination thereof. The selection of such optional additives and their amounts are well within the ability of those skilled in the art. Curing agents are typically present in an amount of from 0 to 20 wt % based on total solids, and preferably from 0 to 3 wt %. Cross-linking agents are typically used in an amount of from 0 to 30 wt % based on total solids, and preferably from 0 to 10 wt %. Surface leveling agents are typically used in an amount of from 0 to 5 wt % based on total solids, and preferably from 0 to 1 wt %. The selection of such optional additives and their amounts used are within the ability of those skilled in the art.

Optionally, the inventive underlayer composition may further comprise one or more curing agents to aid in the curing of the deposited polymer film. A curing agent is any component which causes curing of the underlayer composition on the surface of a substrate. Preferred curing agents are thermal acid generators (TAGs). A TAG is any compound which liberates acid upon exposure to heat. Thermal acid generators are well-known in the art and are commercially available, such as from King Industries, Norwalk, Connecticut. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators. The amount of such curing agents useful in the present compositions may be, for example, from greater than 0 to 10 wt %, and typically from greater than 0 to 3 wt % based on total solids of the underlayer composition.

Preferred curing agents are acids, photoacid generators and thermal acid generators. Suitable acids include but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A photoacid generator is any compound which liberates acid upon exposure to light. A thermal acid generator is any compound which liberates acid upon exposure to heat. Thermal acid generators are well-known in the art and are commercially available. See U.S. Pat. No. 6,261,743 (which is incorporated herein in its entirety by reference) for a discussion of use of a photoacid generator. Thermal acid generators are well-known in the art and are generally commercially available, such as from King Industries, Norwalk, Conn. Exemplary thermal acid generators include, without limitation, amine blocked strong acids, such as amine blocked sulfonic acids, for example amine blocked dodecylbenzenesulfonic acid. It will also be appreciated by those skilled in the art that certain photoacid generators are able to liberate acid upon heating and may function as thermal acid generators.

Examples of cross-linking agents may be amine-based crosslinkers such as melamine materials, including melamine resins such as manufactured by Cytec Industries and sold under the tradename of CYMEL 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name CYMEL 1123 and 1125, and urea resins available from Cytec Industries under the names of POWDERLINK 1174 and 1196. In addition to being commercially available, such amine-based resins may be prepared, for example, by the reaction of acrylamide or methacrylamide copolymers with formaldehyde in an alcohol-containing solution, or alternatively by the copolymerization of N-alkoxymethyl acrylamide or methacrylamide with other suitable monomers. Examples of cross-linking agents may be epoxy resins such as bisphenol A epoxy resin, bisphenol F epoxy resin, novolac epoxy resin, cycloaliphatic epoxy resin, and glycidyl amine epoxy resin.

The present underlayer compositions may optionally include one or more surface leveling agents (or surfactants) and antioxidants. Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Michigan USA), and PF-656 (Omnova Solutions, Beachwood, Ohio, USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, PA and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.). Such surfactants if used may be present in the composition in minor amounts, for example from greater than 0 to 1 wt % based on total solids of the underlayer composition.

An antioxidant may be added to the underlayer composition to prevent or minimize oxidation of organic materials in the composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butylanilino)2,4-bisoctyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylenebis(dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane.

Suitable antioxidants are commercially available, for example, Irganox™ antioxidants (Ciba Specialty Chemicals Corp.). The antioxidant if used may be present in the underlayer composition in an amount, for example, of from greater than 0 to 1 wt % based on total solids of the underlayer composition.

Another aspect of the present invention provides a coated substrate, including a layer of the photoresist underlayer composition disposed on a substrate; and a photoresist layer disposed on the layer of the underlayer composition. The coated substrate may further include a silicon-containing layer and/or an organic antireflective coating layer disposed above the underlayer composition and below the photoresist layer.

The described above compositions can be used to deposit the photoresist underlayer composition including the additive and the poly(arylene ether) as a coating layer on a patterned semiconductor device substrate, where the coating layer has a suitable thickness, such as from 10 nm to 500 µm, preferably from 25 nm to 250 µm, and more preferably from 50 nm to 125 µm, although such coatings may be thicker or thinner than these ranges depending on the particular application. The present compositions substantially fill, preferably fill, and more preferably fully fill, a plurality of gaps on a patterned semiconductor device substrate. An advantage of the present poly(arylene ether) is that they planarize (form planar layers over a patterned substrate) and fill the gaps with substantially no voids being formed, and preferably without forming voids.

Preferably, after being coated on the patterned semiconductor device substrate surface, the resist underlayer composition is heated (soft baked) to remove any organic solvent present. Typical baking temperatures are from 80 to 240° C., although other suitable temperatures may be used. Such baking to remove residual solvent is typically done for approximately 30 seconds to 10 minutes, although longer or shorter times may suitably be used. Following solvent removal, a layer, film, or coating of the resist underlayer on the substrate surface is obtained. Preferably, the resist underlayer is next cured to form an insoluble film. Such curing is typically achieved by heating, such as heating to a temperature of ≥300° C., preferably ≥350° C., and more preferably ≥400° C. Such curing step may take from 1 to 180 minutes, preferably from 1 to 60 minutes, and more preferably from 1 to 10 minutes, although other suitable times may be used. Such curing step may be performed in an oxygen-containing atmosphere or in an inert atmosphere, and preferably in an inert atmosphere.

Yet another aspect of the present invention provides a method of forming a pattern. The method includes: (a) applying a layer of the underlayer composition on a substrate; (b) curing the applied underlayer composition to form an underlayer; and (c) forming a photoresist layer over the underlayer. The method may further include forming a silicon-containing layer and/or an organic antireflective coating layer above the underlayer prior to forming the photoresist layer. The method may further include patterning the photoresist layer and transferring the pattern from the patterned photoresist layer to the underlayer and to a layer below the underlayer.

As used herein, the term "underlayer" refers to all removable processing layers between the substrate and the photoresist layer, for example an organic antireflectant layer, a silicon containing middle layer, spin on carbon layer, and a photoresist underlayer.

A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, poly silicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. Various techniques can form the layers, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

The underlayer composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the underlayer compositions are applied to a substrate which is spinning at a rate from 500 to 4000 rpm for a time from 15 to 90 seconds to obtain a desired layer of the underlayer composition on the substrate. It will be appreciated by those skilled in the art that the thickness of the coated underlayer composition may be adjusted by changing the spin speed, as well as the solids content of the composition. An underlayer formed from the underlayer composition typically has a dried layer thickness of from 5 nm to 50 µm, typically from 25 nm to 3 µm, and more typically from 50 to 500 nm. The underlayer composition may be applied to substantially fill, preferably fill, and more preferably fully fill, a plurality of gaps on the substrate.

The applied underlayer composition is optionally softbaked at a relatively low temperature to remove any solvent and other relatively volatile components from the composition. Exemplary baking temperatures may be from 60 to 240° C., although other suitable temperatures may be used. Such baking to remove residual solvent may be from 10 seconds to 10 minutes, although longer or shorter times may suitably be used. When the substrate is a wafer, such baking step may be performed by heating the wafer on a hot plate.

The applied photoresist underlayer composition is then cured to form an underlayer, for example a photoresist underlayer. The photoresist underlayer composition should be sufficiently cured such that the underlayer does not intermix, or minimally intermixes, with a subsequently applied layer, such as a photoresist or other organic or inorganic layer disposed directly on the underlayer. The photoresist underlayer composition may be cured in an oxygen-containing atmosphere, such as air, or in an inert atmosphere, such as nitrogen and under conditions, such as heating, enough to provide a cured coating layer. This curing step is preferably conducted on a hot plate-style apparatus, although oven curing may be used to obtain equivalent results. The curing temperature should be sufficient to effect curing throughout the layer, for example, sufficient to allow a curing agent such as a free acid to effect crosslinking, or to allow a thermal acid generator to liberate acid and the liberated acid to effect crosslinking where the curing agent is a TAG. Typically, the curing is conducted at a temperature of 150° C. or greater, and preferably from 150 to 450° C. It is more preferred that the curing temperature is 180° C. or greater, still more preferably 200° C. or greater, and even more preferably from 200 to 400° C. The curing time is typically from 10 seconds to 10 minutes, preferably from 30 seconds to 5 minutes, more preferably from 45 seconds to 5 minutes, and still more preferably from 45 to 90 seconds. Optionally, a ramped or a multi-stage curing process may be used. A ramped bake typically begins at a relatively low (e.g., ambient) temperature that is increased at a constant or varied ramp rate to a higher target temperature. A multi-stage curing process involves curing at two or more temperature plateaus, typically a first stage at a lower bake temperature and one or more additional stages at a higher temperature. Conditions for such ramped or multi-stage curing processes are known to those skilled in the art and may allow for omission of a preceding softbake process.

After curing of the photoresist underlayer composition, one or more processing layers, such as a photoresist layer, a hardmask layer such as a metal hardmask layer, an organic or inorganic bottom anti-reflectant coating (BARC) layer, and the like, may be disposed over the cured underlayer. A photoresist layer may be formed directly on the surface of the underlayer or, alternatively, may be formed above the underlayer on one or more intervening layers. In this case, one or more intervening processing layers such as described above can be sequentially formed over the underlayer followed by formation of the photoresist layer. Determination of suitable layers, thicknesses and coating methods are well known to those skilled in the art.

A wide variety of photoresists may be suitably used in the methods of the invention and are typically positive-tone materials. Suitable photoresists include, for example, materials within the EPIC series of photoresists available from DuPont Electronics & Imaging (Marlborough, Massachusetts). The photoresist can be applied to the substrate by known coating techniques such as described above with reference to the underlayer composition, with spin-coating being typical. A typical thickness for the photoresist layer is from 300 to 10000 Å. The photoresist layer is typically next softbaked to minimize the solvent content in the layer, thereby forming a tack-free coating and improving adhesion of the layer to the substrate. The softbake can be conducted on a hotplate or in an oven, with a hotplate being typical. Typical softbakes are conducted at a temperature from 90 to 150° C., and a time from 30 to 90 seconds.

Optionally, one or more barrier layers may be disposed on the photoresist layer. Suitable barrier layers include a topcoat layer, a top antireflectant coating layer (or TARC layer), and the like. Preferably, a topcoat layer is used when the photoresist is patterned using immersion lithography. Such topcoats are well-known in the art and are commercially available, such as OC 2000 available from DuPont Electronics & Imaging. It will be appreciated by those skilled in the art that a TARC layer is not needed when an organic antireflectant layer is used under the photoresist layer.

The photoresist layer is next exposed to activating radiation through a photomask to create a difference in solubility between exposed and unexposed regions. References herein to exposing a photoresist composition to radiation that is activating for the composition indicates that the radiation can form a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as 248 nm (KrF), 193 nm (ArF), or an extreme ultraviolet (EUV) wavelength (e.g., 13.5 nm). In a preferred aspect, the exposure wavelength is 193 nm. The exposure energy is typically from 10 to 80 mJ/cm$^2$, depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature of from 80 to 150° C., and a time of from 30 to 90 seconds. A latent image defined by the boundary between polarity-switched and unswitched regions (corresponding to exposed and unexposed regions, respectively) is thereby formed. The exposed photoresist layer is then developed using the appropriate developer to provide a patterned photoresist layer.

The pattern of the photoresist layer can then be transferred to one or more underlying layers including the underlayer and to the substrate by appropriate etching techniques, such as by plasma etching or wet etching. Plasma etching may use an appropriate gas species for each layer being etched. Suitable wet chemical etch chemistries include, for example, mixtures comprising ammonium hydroxide, hydrogen peroxide, and water (e.g., SC-1 clean); mixtures comprising hydrochloric acid, hydrogen peroxide, and water (e.g., SC-2 clean); mixtures comprising sulfuric acid, hydrogen peroxide, and water (e.g., SPM clean); mixtures comprising phosphoric acid, hydrogen peroxide, and water; mixtures comprising hydrofluoric acid and water; mixtures comprising hydrofluoric acid, phosphoric acid, and water; mixtures comprising hydrofluoric acid, nitric acid, and water; mixtures comprising tetramethylammonium hydroxide and water; and the like.

Depending on the number of layers and materials involved, pattern transfer may involve multiple etching steps using different techniques. The patterned photoresist layer, underlayer, and other optional layers in the lithographic stack may be removed following pattern transfer of the substrate using conventional techniques. Optionally, one or more of the layers of the stack may be removed, or is consumed, following pattern transfer to an underlying layer and prior to pattern transfer to the substrate. The substrate is then further processed according to known processes to form an electronic device.

The photoresist underlayer composition may also be used in a self-aligned double patterning process. In such a process, a layer of the photoresist underlayer composition described above is coated on a substrate, such as by spin-coating. Any remaining organic solvent is removed, and the coating layer is cured to form a photoresist underlayer. A suitable middle layer, such as a silicon-containing hardmask layer is optionally coated on the photoresist underlayer. A layer of a suitable photoresist is then coated on the middle layer, such as by spin coating. The photoresist layer is then imaged (exposed) and the exposed photoresist layer is then developed using the appropriate developer to provide a patterned photoresist layer. The pattern is next transferred from the photoresist layer to the middle layer and the underlayer by appropriate etching techniques to expose portions of the substrate. Typically, the photoresist is also removed during such etching step. Next, a conformal silicon-containing layer is disposed over the patterned underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned underlayer and a portion of the substrate. Following this partial etching step, the pattern on the substrate comprises a plurality of features, each feature comprising a line or post of the underlayer with the silicon-containing layer directly adjacent to the sides of each underlayer feature. Next, exposed regions of the underlayer are removed, such as by etching, to expose the substrate surface that was under the underlayer pattern, and providing a patterned silicon-containing layer on the substrate surface, where such patterned silicon-containing layer is doubled (that is, twice as many lines and/or posts) as compared to the patterned underlayer.

Photoresist underlayers formed from the inventive photoresist underlayer compositions show excellent planarization, good solvent resistance, tunable etch rates, and good resistance to wet chemical etchants. Preferred photoresist underlayer compositions of the invention may, as a result, be useful in a variety of semiconductor manufacturing processes The present inventive concept is further illustrated by the following examples. All compounds and reagents used herein are available commercially except where a procedure is provided below.

EXAMPLES

Matrix Polymer Synthesis

Example 1: Poly(Arylene Ether) Oligomer (I)

A mixture of 30.0 grams (g) of 3,3'-(oxydi-1,4-phenylene) bis(2,4,5-triphenylcyclopentadienone) (DPO-CPD), 18.1 g of 1,3,5-tris(phenylethynyl)benzene (TRIS), and 102.2 g of GBL were heated at 185° C. for 14 hours. The reaction was then allowed to cool to room temperature and diluted with 21.5 g of GBL to form a crude product mixture. The crude product mixture was added to 1.7 liters (L) of a 1:1 mixture of iso-propyl alcohol (IPA)/PGME and stirred for 30 minutes. The solids were collected by vacuum filtration and washed with IPA/PGME (1:1 v/v). To the solids was added 0.4 L of deionized water and the resulting slurry was heated to 50° C. and then stirred at 50° C. for an additional 30 minutes. The warm slurry was then filtered using vacuum filtration to obtain a wet solid, which was dried in a vacuum oven at 70° C. for 2 days to provide 34.1 g of poly(arylene ether) oligomer 1 in a 71% yield. Analysis provided a $M_w$ of 3487 Da and a PDI of 1.42.

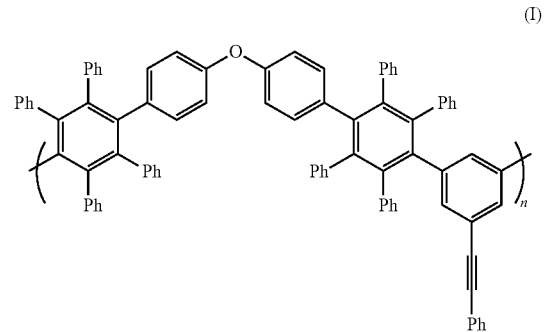

(I)

Additive Synthesis

Example 2: Dopamine Salicylate (VIII)

Dopamine hydrochloride (2.02 g) and silver salicylate (2.69 g) were added to a solution of methanol (50 mL) and water (5 mL) at room temperature. The resulting mixture was then heated at 35° C. with stirring for 18 hours. After the reaction was completed, the crude product was filtered over Celite and washed with methanol, and then the collected solution of crude product was concentrated to dryness to afford a yellow oil. The crude product was dissolved in PGMEA and eluted over a plug of silica gel, and then concentrated to dryness to give 3 g of product (VIII).

Example 3: OH-TRIS (IX)

1,3,5-Tribromobenzene (2.36 g), cuprous iodide (0.21 g), and triethylamine (3.42 g) were added to 20 g of 1,4-dioxane at room temperature. The reaction mixture was purged using nitrogen gas bubbling for 1 hour. Bis(triphenylphosphine)palladium(II) chloride (0.53 g) was added to the reaction mixture, and the resulting mixture was heated to 70° C. 4-Ethynylphenyl acetate (4.81 g) was dissolved in an aliquot of nitrogen-degassed 1,4-dioxane (14 g), and this solution was then slowly added to the mixture by addition funnel. After completion of the addition, the reaction contents were stirred at 70° C. for 18 hours under nitrogen. After the reaction was completed, the reaction mixture cooled to room temperature, and the resulting crude product was filtered, and the solvents were evaporated. The residue was purified by column chromatography to give a light-yellow solid. The semi-purified solid was subsequently dissolved in THF (35 g) under nitrogen. Lithium hydroxide monohydrate (0.94 g) and water (8 g) were then added thereto, and the resulting reaction mixture was stirred at 60° C. for 1 hour. After this time, the reaction mixture was diluted with ethyl acetate and then the pH of the aqueous layer was adjusted using hydrochloric acid until a pH of 1 was obtained. The organic phase was then separated, and the aqueous phase was extracted again with ethyl acetate. The combined organic layers were washed with water and the solvent was removed under vacuum to obtain 1,3,5-tris((4-hydroxyphenyl)ethynyl)benzene as a light-yellow solid, 2.6 g (81% yield).

Example 4: Propargyl OH-TRIS (X)

1,3,5-tris((4-hydroxyphenyl)ethynyl)benzene in 46 g anhydrous dimethylformamide (DMF) was stirred at room temperature for 15 minutes. The mixture was heated to 3° C. and 10.34 g of $K_2CO_3$ was added thereto. The reaction was then heated to 50° C. and 8.63 g of a propargyl bromide solution (80 wt % in toluene) was added dropwise via additional funnel. The reaction mixture was heated at 50° C. for 24 hours. The reaction was then allowed to cool to room temperature and was filtered to remove the $K_2CO_3$. The resulting organic solution was precipitated into 2 L of deionized water and then stirred at room temperature for 30 minutes. The precipitated material was then collected by filtration and dried under vacuum at 35° C. for 1 day to afford a 17.8 g of a solid product.

Example 5: Acetoxy OH-TRIS (XI)

1,3,5-Tribromobenzene (2.36 g), cuprous iodide (0.21 g), and triethylamine (3.42 g) were added to 20 g of 1,4-dioxane at room temperature. The reaction mixture was purged with nitrogen gas bubbling for 1 hour. Bis(triphenylphosphine)palladium(II) chloride (0.53 g) was then added to the reaction mixture, and the resulting reaction mixture was heated to 70° C. 4-Ethynylphenyl acetate (4.81 g) was dissolved in nitrogen-degassed 1,4-dioxane (14 g), and the solution was then slowly added to the reaction mixture using an addition funnel. After completion of addition, the reaction mixture was stirred at 70° C. for 18 hours under nitrogen. After the reaction was completed, the reaction mixture cooled to room temperature, the contents were filtered, and the solvents were evaporated to afford a crude product. The crude product was purified by column chromatography to give 1,3,5-tris((4-acetoxyphenyl)ethynyl)benzene as a light-yellow solid, 3.5 g (84% yield).

Example 6: Methoxy OH-TRIS (XII)

1,3,5-Tribromobenzene (3.12 g), cuprous iodide (0.29 g), and triethylamine (4.55 g) were added to 22 g of 1,4-dioxane at room temperature. The reaction mixture was purged with nitrogen gas bubbling for 1 hour. Bis(triphenylphosphine)palladium(II) chloride (0.70 g) was then added to the reaction mixture, and the reaction mixture was heated to 70° C. 1-ethynyl-4-methoxybenzene (5.28 g) was dissolved in nitrogen-degassed 1,4-dioxane (20 g), and the solution was then slowly added to the reaction mixture using an addition funnel. After completion of addition, the reaction mixture was stirred at 70° C. for 18 hours under nitrogen. After the reaction was completed, the reaction contents cooled to room temperature, the product was filtered, and the solvents were evaporated to afford a crud product. The crude product was purified by column chromatography to give 1,3,5-tris((4-methoxyphenyl)ethynyl)benzene as a light-yellow solid, 4.0 g (85% yield).

The additive compounds of formulae (II) to (VII) were purchased from commercially available sources and used without further preparation.

The structures of the compounds of formulae (II) to (XII) are shown below:

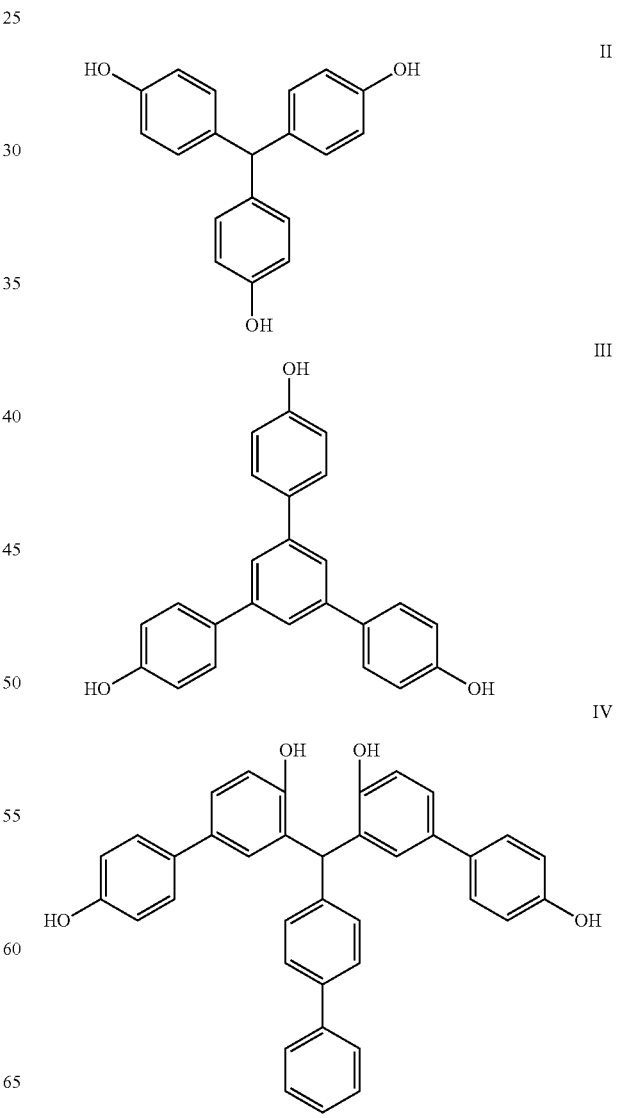

V
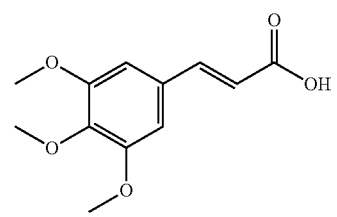
VI
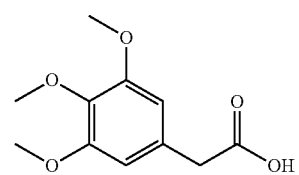
VII
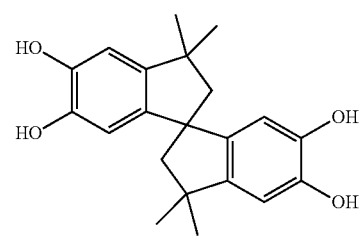
VIII
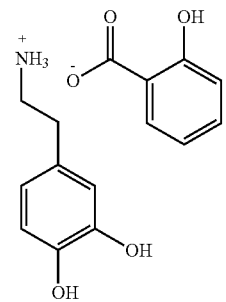
IX
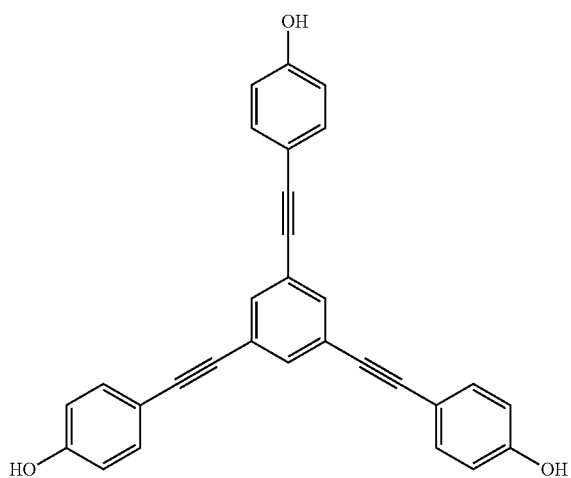
X
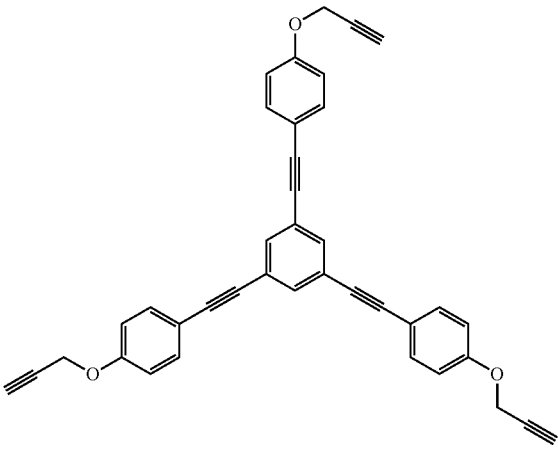
XI
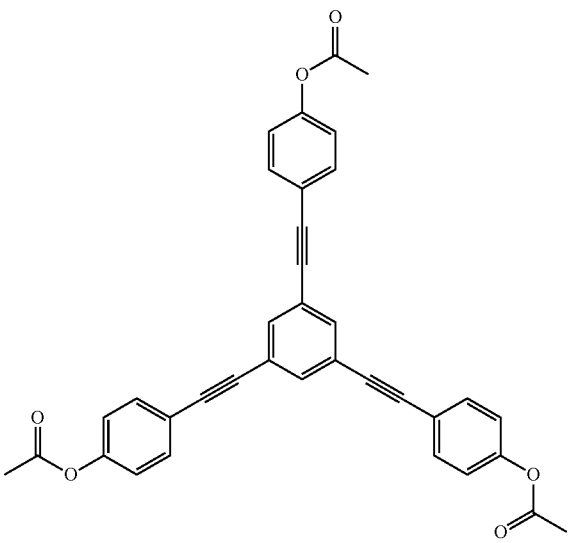
XII
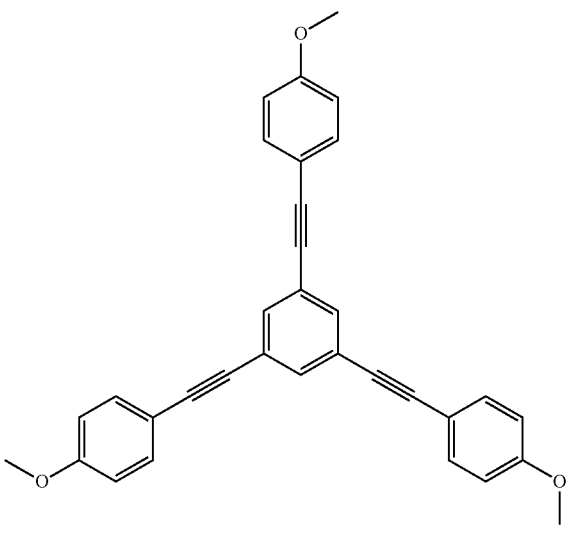

EVALUATION EXAMPLES

Formulations with Additive

The inventive formulations were prepared by dissolving a polymer and one or more adhesion promoting additives in a mixture of PGMEA and benzyl benzoate (97:3, w/w) at about 4 wt % solids. The amount of the additive relative to the total solids is provided in Table 1, below. The obtained solutions were filtered through a 0.2 μm poly(tetrafluoroethylene) (PTFE) syringe filter.

Formulations without Additive

The formulations were prepared by dissolving a polymer in a mixture of PGMEA and benzyl benzoate (97:3, w/w) at about 4 wt % solids. The obtained solutions were filtered through a 0.2 μm poly(tetrafluoroethylene) (PTFE) syringe filter.

Standard Coating and Cleaning

The standard coating process of the above formulations was performed on 200 mm silicon wafers with a 10 nm TiN coating deposited by CVD. The above formulations were coated on the TiN-coated wafers by spin-coating, soft baking at 170° C. for 60 seconds, and then hard baking at 450° C. for 4 minutes.

The standard cleaning solution (SC1) was prepared by mixing 30% ammonium hydroxide, 30% hydrogen peroxide, and deionized water at a ratio of 1:5:40 (w/w/w). Both ammonium hydroxide and hydrogen peroxide were purchased from Fisher Scientific and used as received. Wafer coupons that were coated with photoresist underlayer films were immersed into a bath containing SC1 at 70° C. with gentle agitation. The treated coupons were rinsed with deionized water twice and then air dried. The time before significant film delamination (visual observation) was recorded to evaluate the resistance of the SOC coating to stripping by the SC1. Film thickness was measured before and after the treatment with the SC1 on the non-delaminated area and shown to not change, verifying that the photoresist underlayer films were not etched under the wet etch conditions.

TABLE 1

| Formulation | Matrix Polymer | Additive | Additive amount (wt % of solids) | Standard cleaning time to film delamination (minutes) |
|---|---|---|---|---|
| 1 | I | II | 2 | 1.5 |
| 2 | I | III | 2 | 2.5 |
| 3 | I | IV | 2 | 4 |
| 4 | I | V | 2 | 1.5 |
| 5 | I | VI | 2 | 1.5 |
| 6 | I | VII | 1.4 | 3.5 |
| 7 | I | VIII | 2 | 3.3 |
| 8 | I | IX | 1.2 | >8 |
| 9 | I | IX | 2.4 | >8 |
| 10 | I | IX | 3.6 | >8 |
| 11 | I | X | 2 | 2 |
| 12 | I | X | 3 | 1.8 |
| 13 | I | X | 10 | >8 |
| 14 | I | X | 20 | >8 |
| 15 | I | XI | 3.1 | >8 |
| 16 | I | XII | 2.6 | 2.3 |
| C1 | I | — | 0 | 1 |

Examples disclosed in Table 1 demonstrate that the inventive formulations 1 to 16 exhibit superior resistance to wet chemical etch conditions of a standard cleaning solution. In particular, the comparative formulation $C_1$ delaminated at 1 minute, whereas inventive formulations 1 to 16 each took longer than 1 minute to be delaminated from the substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist underlayer composition, comprising:
   a poly (arylene ether) derived from a compound containing two or more cyclopentadienone moieties, wherein the compound is free of a solubility enhancing polar moiety;
   an additive of formula (14):

$$D\text{-}(L^1\text{-}Ar\text{—}[X]_n)_m \quad (14); \text{ and}$$

a solvent,
   wherein, in formula (14),
   D is a substituted or unsubstituted $C_{1-60}$ organic group, optionally wherein D is an organic acid salt of the substituted or unsubstituted $C_{1-60}$ organic group;
   each $L^1$ is independently a single bond or a divalent linking group,
   when $L^1$ is a single bond, D may be a substituted or unsubstituted $C_{3-30}$ cycloalkyl or substituted or unsubstituted $C_{1-20}$ heterocycloalkyl that is optionally fused with Ar,
   each Ar is independently a monocyclic or polycyclic $C_{5-60}$ aromatic group,
   each X is independently $-OR^{30}$, $-SR^{31}$, or $-NR^{32}R^{33}$,
   m is an integer of 1 to 6,
   each n is independently an integer of 0 to 5, provided that a sum of all n is 2 or greater,
   $R^{30}$ to $R^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O)$_2$—, or $-NR^{34}$— wherein $R^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl, and
   when n is 2, optionally any one of $R^{30}$ to $R^{33}$ of a first group X is a divalent group, any one of $R^{30}$ to $R^{33}$ of a second group X is a divalent group, and the divalent group of the first group X forms a ring together with the divalent group of the second group X, wherein the ring optionally further comprises a linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{6-30}$ arylene, —O—, —C(O)—, —C(O)O—, —NR$^{35}$—, —S—, —S(O)—, or —S(O)$_2$—, wherein R$^{35}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

2. The photoresist underlayer composition of claim 1, wherein D is a polyvalent $C_{1-30}$ alkyl, a polyvalent $C_{3-30}$ cycloalkyl, a polyvalent $C_{1-20}$ heterocycloalkyl, a polyvalent $C_{6-30}$ aryl, a polyvalent $C_{6-30}$ heteroaryl, —NH$_2$ or an organic acid salt thereof, or —C(O)OR$^{22}$ wherein R$^{22}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

3. The photoresist underlayer composition of claim 1, wherein
D is a polyvalent $C_{1-30}$ alkyl, a polyvalent $C_{3-30}$ cycloalkyl, a polyvalent $C_{6-30}$ aryl, or a polyvalent $C_{6-30}$ heteroaryl,
each L$^1$ is independently a single bond or a divalent linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —NR$^{23}$—, —S—, —S(O)—, —S(O)$_2$—, or —C(O)NR$^{23}$—,
R$^{23}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl,
each Ar is independently a monocyclic or polycyclic $C_{6-60}$ arylene group,
each X is independently —OR$^{30}$ or —NR$^{32}$R$^{33}$,
R$^{30}$, R$^{32}$, and R$^{33}$ are the same as provided for claim 1,
m is an integer of 2 to 4, and
the sum of n is 3 or greater.

4. A photoresist underlayer composition, comprising:
a poly (arylene ether) derived from a compound containing two or more cyclopentadienone moieties,
an additive of formula (15):

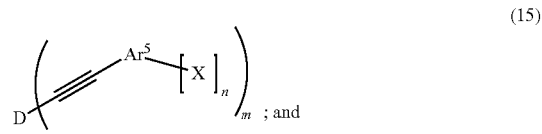

a solvent,
wherein, in formula (15),
D is a polyvalent $C_{1-30}$ alkyl, a polyvalent $C_{3-30}$ cycloalkyl, a polyvalent $C_{6-30}$ aryl, or a polyvalent $C_{6-30}$ heteroaryl,
each Ar$^5$ is a monocyclic or polycyclic $C_{6-60}$ arylene group or a monocyclic or polycyclic $C_{5-60}$ heteroarylene group,
each X is independently —OR$^{30}$, —SR$^{31}$, or —NR$^{32}$R$^{33}$,
R$^{30}$ to R$^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O) 2—, or —NR$^{34}$— wherein R$^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl,
m is an integer of 2 to 4, and
each n is independently an integer of 1 to 5, provided that the sum of n is 3 or greater.

5. The photoresist underlayer composition of claim 1, wherein in formula (14), each X is independently —OR$^{30}$, wherein each R$^{30}$ is independently hydrogen, substituted or unsubstituted $C_{1-10}$ alkyl, substituted or unsubstituted —C(O)—$C_{1-6}$ alkyl, substituted or unsubstituted $C_{3-10}$ cycloalkyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

6. A photoresist underlayer composition, comprising:
a poly (arylene ether) derived from a compound containing two or more cyclopentadienone moieties;

an additive of formula (14):

$$D\text{-}(L^1\text{-}Ar\text{—}[X]_n)_m \qquad (14); \text{ and}$$

a solvent,
wherein, in formula (14), $$D \text{ is } \text{—}(C(O)O^-)(M^+) \text{ or } \text{—}(NH_3^+)(Z^-),$$

$M^+$ is an organic cation,
$Z^-$ is an organic anion,
each $L^1$ is independently a divalent linking group,
m is 1,
each Ar is independently a monocyclic or polycyclic $C_{5-60}$ aromatic group,
each X is independently —$OR^{30}$, —$SR^{31}$, or —$NR^{32}R^{33}$,
n is an integer of 2 to 4, and
$R^{30}$ to $R^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O)$_2$—, or —NR$^{34}$— wherein $R^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

7. The photoresist underlayer composition of claim 1, wherein the additive is present in an amount from 0.1 to 20 wt %, based on total solids of the photoresist underlayer composition.

8. A method of forming a pattern, the method comprising: (a) applying a layer of the photoresist underlayer composition of claim 1 on a substrate; (b) curing the applied photoresist underlayer composition to form a photoresist underlayer; and (c) forming a photoresist layer over the photoresist underlayer.

9. The method of claim 8, further comprising forming a silicon-containing layer, an organic antireflective coating layer, or a combination thereof, above the photoresist underlayer prior to forming the photoresist layer.

10. The method of claim 8, further comprising patterning the photoresist layer and transferring a pattern from the patterned photoresist layer to the coating layer and to a layer below the photoresist underlayer.

11. The method of claim 8, wherein D is a polyvalent $C_{1-30}$ alkyl, a polyvalent $C_{3-30}$ cycloalkyl, a polyvalent $C_{1-20}$ heterocycloalkyl, a polyvalent $C_{6-30}$ aryl, a polyvalent $C_{6-30}$ heteroaryl, —NH$_2$ or an organic acid salt thereof, or —C(O)OR$^{22}$ wherein $R^{22}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

12. The method of claim 8, wherein
D is a polyvalent $C_{1-30}$ alkyl, a polyvalent $C_{3-30}$ cycloalkyl, a polyvalent $C_{6-30}$ aryl, or a polyvalent $C_{6-30}$ heteroaryl,
each $L^1$ is independently a single bond or a divalent linking group comprising one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —NR$^{23}$—, —S—, —S(O)—, —S(O)$_2$—, or —C(O)NR$^{23}$—,
$R^{23}$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl,
each Ar is independently a monocyclic or polycyclic $C_{6-60}$ arylene group,
each X is independently —$OR^{30}$ or —$NR^{32}R^{33}$,
$R^{30}$, $R^{32}$, and $R^{33}$ are the same as provided for claim 1,
m is an integer of 2 to 4, and
the sum of n is 3 or greater.

13. The method of claim 8, wherein the additive is of formula (15):

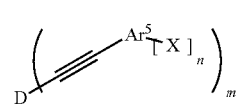

wherein,
D is a polyvalent $C_{1-30}$ alkyl, a polyvalent $C_{3-30}$ cycloalkyl, a polyvalent $C_{6-30}$ aryl, or a polyvalent $C_{6-30}$ heteroaryl,
each $Ar^5$ is a monocyclic or polycyclic $C_{6-60}$ arylene group or a monocyclic or polycyclic $C_{5-60}$ heteroarylene group,
each X is independently —$OR^{30}$, —$SR^{31}$, or —$NR^{32}R^{33}$,
$R^{30}$ to $R^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O) 2—, or —NR$^{34}$— wherein R$^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl, m is an integer of 2 to 4, and each n is independently an integer of 1 to 5, provided that the sum of n is 3 or greater.

14. The method of claim 8, wherein in formula (14), each X is independently —OR$^{30}$, wherein each R$^{30}$ is independently hydrogen, substituted or unsubstituted $C_{1-10}$ alkyl, substituted or unsubstituted-C(O)—$C_{1-6}$ alkyl, substituted or unsubstituted $C_{3-10}$ cycloalkyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

15. The method of claim 8, wherein, in formula (14),

D is —(C(O)O$^-$)(M$^+$) or —(NH$_3^+$)(Z$^-$),

M$^+$ is an organic cation,

Z$^-$ is an organic anion, each L$^1$ is independently a divalent linking group, m is 1, each Ar is independently a monocyclic or polycyclic $C_{5-60}$ aromatic group, each X is independently —OR$^{30}$, —SR$^{31}$, or —NR$^{32}$R$^{33}$, n is an integer of 2 to 4, and R$^{30}$ to R$^{33}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, each of which except hydrogen optionally further comprises as part of its structure one or more of substituted or unsubstituted $C_{1-30}$ alkylene, substituted or unsubstituted $C_{3-30}$ cycloalkylene, substituted or unsubstituted $C_{2-30}$ alkenylene, substituted or unsubstituted $C_{4-30}$ cycloalkenylene, substituted or unsubstituted $C_{2-30}$ alkynylene, substituted or unsubstituted $C_{1-30}$ heterocycloalkylene, substituted or unsubstituted $C_{6-30}$ arylene, substituted or unsubstituted $C_{4-30}$ heteroarylene, —O—, —C(O)—, —C(O)O—, —S—, —S(O)—, —S(O) 2—, or —NR$^{34}$— wherein R$^{34}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

16. The method of claim 8, wherein the additive is present in an amount from 0.1 to 20 wt %, based on total solids of the photoresist underlayer composition.

17. The photoresist underlayer composition of claim 1, wherein the poly (arylene ether) is prepared by a Diels-Alder polymerization of one or more first monomers and one or more second monomers, and optionally an end capping monomer, wherein the one or more first monomers are the compound containing two or more cyclopentadienone moieties, wherein the compound is free of the solubility enhancing polar moiety, and wherein the one or more second monomers comprise a compound having an aryl moiety and two or more alkynyl groups capable of undergoing a Diels-Alder reaction.

18. The photoresist underlayer composition of claim 17, wherein the one or more second monomers are free of a solubility enhancing polar moiety.

* * * * *